(12) United States Patent
Ikesu et al.

(10) Patent No.: US 12,203,974 B2
(45) Date of Patent: Jan. 21, 2025

(54) SEMICONDUCTOR FAULT ANALYSIS DEVICE AND SEMICONDUCTOR FAULT ANALYSIS METHOD

(71) Applicant: HAMAMATSU PHOTONICS K.K., Hamamatsu (JP)

(72) Inventors: Masataka Ikesu, Hamamatsu (JP); Shinsuke Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 21 days.

(21) Appl. No.: 17/799,009

(22) PCT Filed: Jan. 13, 2021

(86) PCT No.: PCT/JP2021/000888
§ 371 (c)(1),
(2) Date: Aug. 11, 2022

(87) PCT Pub. No.: WO2021/166496
PCT Pub. Date: Aug. 26, 2021

(65) Prior Publication Data
US 2023/0061399 A1 Mar. 2, 2023

(30) Foreign Application Priority Data
Feb. 18, 2020 (JP) .................. 2020-025354

(51) Int. Cl.
*G01R 31/265* (2006.01)
*G01R 31/28* (2006.01)
(Continued)

(52) U.S. Cl.
CPC ..... *G01R 31/2656* (2013.01); *G01R 31/2891* (2013.01); *G01R 31/2894* (2013.01); *G01R 31/311* (2013.01); *H01L 22/00* (2013.01)

(58) Field of Classification Search
CPC .. G01R 31/265; G01R 31/01; G01R 31/2656; G01R 31/2891; G01R 31/2894;
(Continued)

(56) References Cited

U.S. PATENT DOCUMENTS

2003/0102292 A1 6/2003 Han et al.
2010/0026328 A1 2/2010 Tanaka
(Continued)

FOREIGN PATENT DOCUMENTS

JP H5-121504 A 5/1993
JP H098103 A * 1/1997 ............... G03F 9/70
(Continued)

OTHER PUBLICATIONS

International Preliminary Report on Patentability mailed Sep. 1, 2022 for PCT/JP2020/042821.
(Continued)

*Primary Examiner* — Alesa Allgood
*Assistant Examiner* — Courtney G McDonnough
(74) *Attorney, Agent, or Firm* — Faegre Drinker Biddle & Reath LLP

(57) ABSTRACT

A control part of a semiconductor fault analysis device outputs an alignment command that moves a chuck to a position at which a target is detectable by a first optical detection part and then aligns an optical axis of a second optical system with an optical axis of a first optical system with the target as a reference, and outputs an analysis command that applies a stimulus signal to a semiconductor device and receives light from the semiconductor device emitted according to a stimulus signal with at least one of a first optical detection part and a second optical detection part in a state in which a positional relationship between the optical axis of the first optical system and the optical axis of the second optical system is maintained.

24 Claims, 16 Drawing Sheets

(51) Int. Cl.
*G01R 31/311* (2006.01)
*H01L 21/66* (2006.01)

(58) Field of Classification Search
CPC .... G01R 31/303; G01R 31/311; B23K 26/00;
H01L 21/67282; H01L 21/681; H01L
22/00; H01L 22/12
USPC .................................................... 324/754.23
See application file for complete search history.

(56) References Cited

U.S. PATENT DOCUMENTS

2018/0033704 A1  2/2018  Suzuki et al.
2019/0221486 A1  7/2019  Suzuki et al.

FOREIGN PATENT DOCUMENTS

| JP | 2002-168798 A | 6/2002 |
| JP | 2002-340990 A | 11/2002 |
| JP | 2004-146428 A | 5/2004 |
| JP | 2008-261667 A | 10/2008 |
| JP | 2010-219110 A | 9/2010 |
| JP | 2014-092514 A | 5/2014 |
| JP | 2016-148550 A | 8/2016 |
| KR | 101008319 B1 | 1/2011 |
| WO | WO-2016/056110 A1 | 4/2016 |

OTHER PUBLICATIONS

International Preliminary Report on Patentability mailed Sep. 1, 2022 for PCT/JP2021/000888.

\* cited by examiner

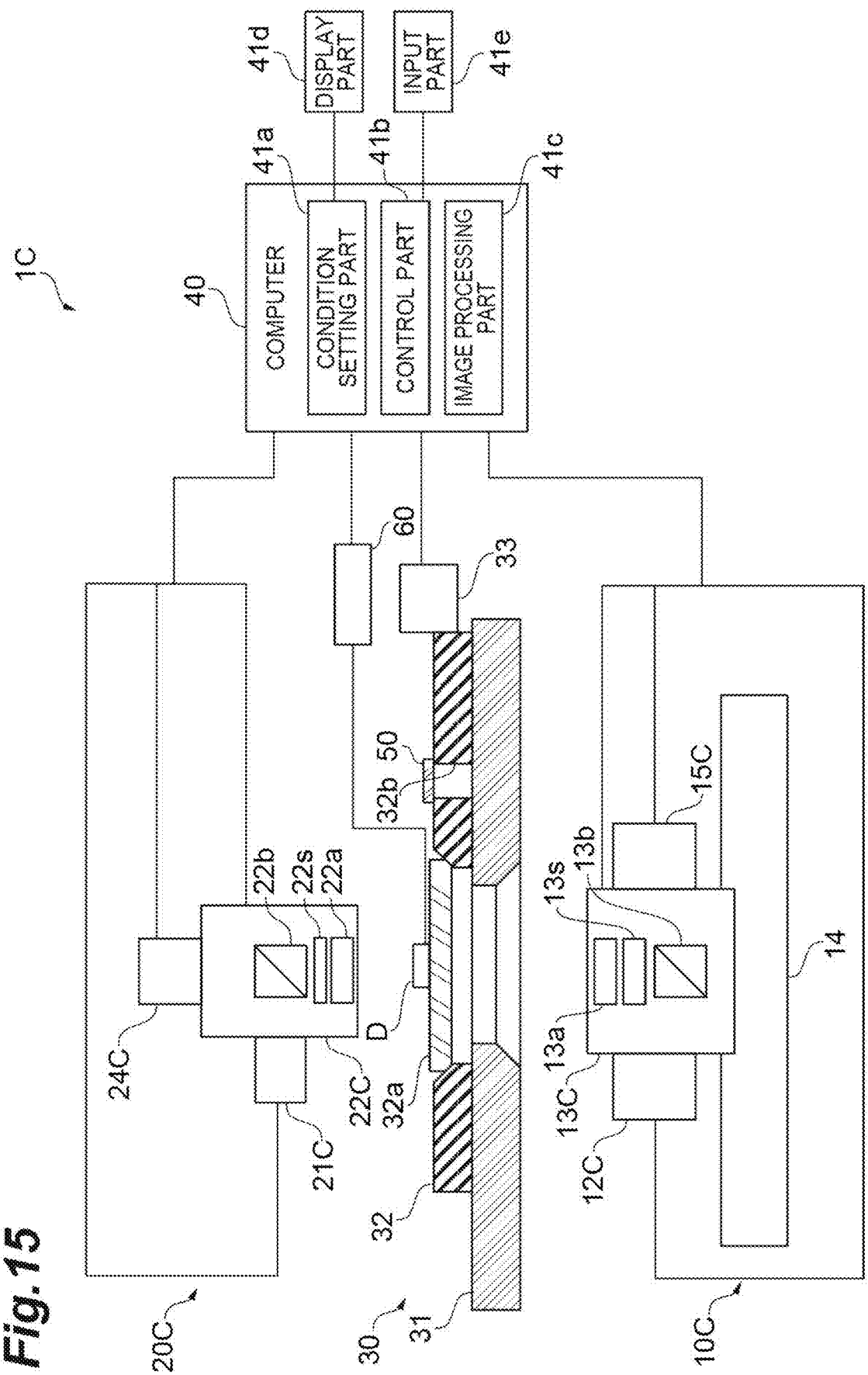

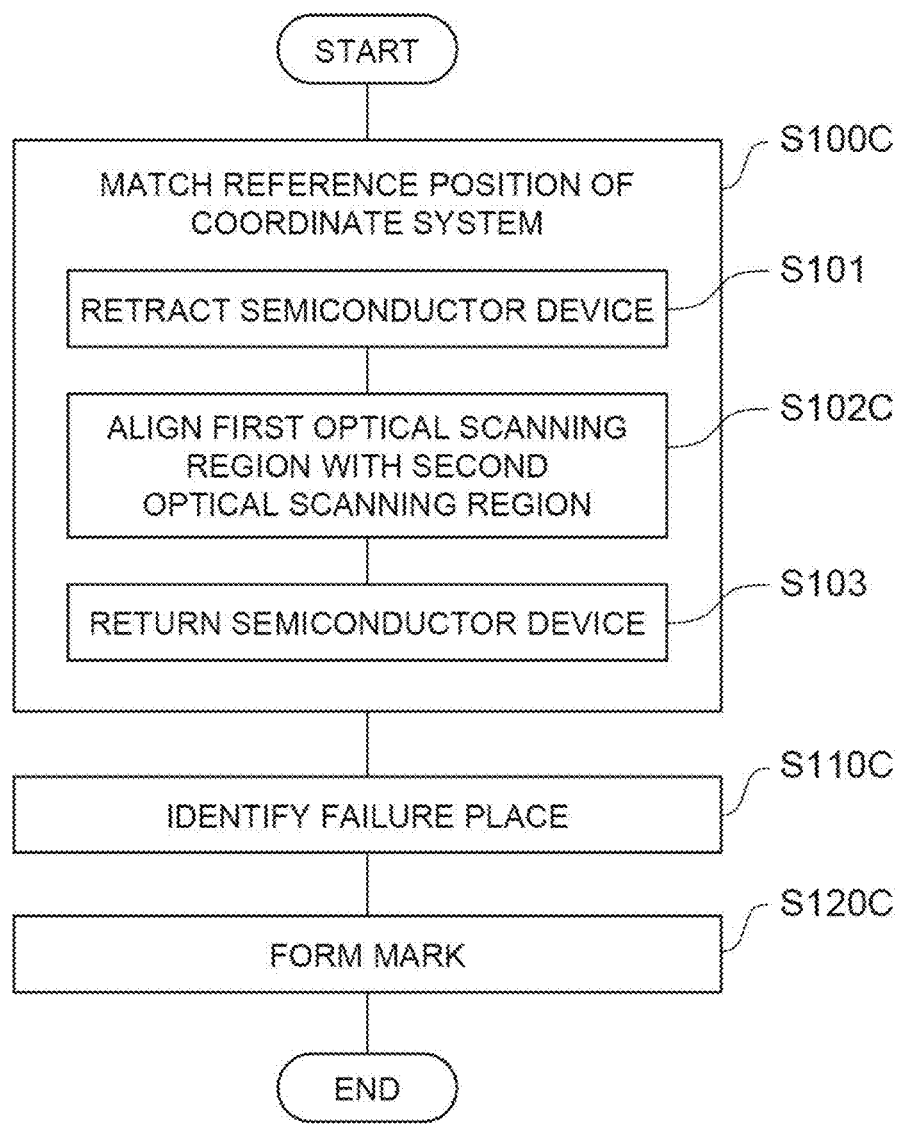

SEMICONDUCTOR FAULT ANALYSIS DEVICE AND SEMICONDUCTOR FAULT ANALYSIS METHOD

TECHNICAL FIELD

The present invention relates to a semiconductor fault analysis device and a semiconductor fault analysis method.

BACKGROUND ART

The miniaturization of semiconductor devices is progressing. In the miniaturization of semiconductor devices, it is desired to improve an exposure technique and a patterning technique for manufacturing a semiconductor device. In addition, a technique for clarifying whether or not a semiconductor device manufactured by such techniques operates normally is important. Furthermore, when the semiconductor device does not operate normally, a technique for clarifying a cause of the problem is also important.

Patent Literatures 1 and 2 disclose apparatuses for inspecting a semiconductor device. The inspection apparatuses irradiate a semiconductor device to which an electrical signal is applied with light. The light radiated to the semiconductor device becomes reflected light according to a state of the semiconductor device. Then, the inspection apparatuses utilize the reflected light to obtain information on an operating state of the semiconductor device. The inspection apparatus of Patent Literature 1 obtains information about a part of a semiconductor apparatus operating at a predetermined frequency. The inspection apparatus of Patent Literature 2 obtains information on a heat source generated at a failure place in a semiconductor device.

CITATION LIST

Patent Literature

[Patent Literature 1] Japanese Unexamined Patent Publication No. 2014-92514
[Patent Literature 2] PCT International Publication No. WO2016/056110

SUMMARY OF INVENTION

Technical Problem

In the technical field of semiconductor fault analysis devices, a technique for satisfactorily detecting a failure place of a semiconductor device is desired. Therefore, the present invention provides a semiconductor fault analysis device and a semiconductor fault analysis method for satisfactorily detecting a failure place in a semiconductor device.

Solution to Problem

A semiconductor fault analysis device according to an aspect of the present invention includes a first analysis part in which a first optical detection part receives light emitted by a semiconductor device via a first optical system, and the first optical system is moved relative to the semiconductor device by a first drive part, a second analysis part in which a second optical detection part receives light emitted by the semiconductor device via a second optical system, and the second optical system is moved relative to the semiconductor device by a second drive part, a device arrangement part having a chuck disposed between the first analysis part and the second analysis part to hold the semiconductor device and provided with a target that aligns an optical axis of the first optical system with an optical axis of the second optical system, the chuck being moved relative to the first analysis part and the second analysis part, a stimulus signal application part configured to apply a stimulus signal to the semiconductor device, and a control part configured to output a command to the first analysis part, the second analysis part, the device arrangement part, and the stimulus signal application part. The target is detectable by the first analysis part from one side of the target and is detectable by the second analysis part from the other side of the target. The control part outputs an alignment command that moves the chuck to a position at which the target is detectable by the first optical detection part and then aligns the optical axis of the second optical system with the optical axis of the first optical system with the target as a reference to the second analysis part and the device arrangement part, and outputs an analysis command that applies a stimulus signal to the semiconductor device and receives light from the semiconductor device emitted according to the stimulus signal with at least one of the first optical detection part and the second optical detection part in a state in which a positional relationship between the optical axis of the first optical system and the optical axis of the second optical system is maintained to the first analysis part, the second analysis part, the stimulus signal application part, and the device arrangement part.

In the semiconductor fault analysis device, in the state in which the positional relationship between the optical axis of the first optical system and the optical axis of the second optical system is maintained, the stimulus signal is applied to the semiconductor device, and light from the semiconductor device emitted according to the stimulus signal is received by at least one of the first optical detection part and the second optical detection part. Therefore, since the optical axes of the first optical system and the second optical system that receive the light from the semiconductor device coincide with each other, a failure place in the semiconductor device can be appropriately detected.

In the semiconductor fault analysis device according to the aspect, the alignment command may cause the first optical detection part to acquire a first image of the target from one side, may cause the second optical detection part to acquire a second image of the target from the other side, and may move the second optical system based on the first image and the second image so that the optical axis of the second optical system is aligned with the optical axis of the first optical system.

In the semiconductor fault analysis device according to the aspect, the analysis command may cause the chuck to be moved by a third drive part included in the device arrangement part so that the semiconductor device overlaps the optical axis of the first optical system and the optical axis of the second optical system and then may cause the semiconductor device to be analyzed.

In the semiconductor fault analysis device according to the aspect, the target may be provided at a position different from a device holding part in which the semiconductor device is held in the chuck.

In the semiconductor fault analysis device according to the aspect, the first optical detection part may acquire a first image of the target seen from one side. The second optical detection part may acquire a second image of the target seen from the other side.

In the semiconductor fault analysis device according to the aspect, the target may include a light transmission part which transmits light that is detectable by the first optical detection part and the second optical detection part.

A semiconductor fault analysis device according to another aspect includes a first analysis part configured to irradiate a semiconductor device with light generated by a first light source via a first optical system having a first optical scanning part, a second analysis part configured to irradiate the semiconductor device with light generated by a second light source via a second optical system having a second optical scanning part, a device arrangement part having a chuck disposed between the first analysis part and the second analysis part to hold the semiconductor device and provided with a target that aligns a center of an optical scanning region of the first optical system with a center of an optical scanning region of the second optical system, the chuck being moved relative to the first analysis part and the second analysis part, an electrical signal acquisition part configured to receive an electrical signal output by the semiconductor device, and a control part configured to output a command to the first analysis part, the second analysis part, the device arrangement part, and the electrical signal acquisition part. The target is detectable by the first analysis part from one side of the target and is detectable by the second analysis part from the other side of the target. The control part outputs an alignment command that moves the chuck to a position at which the target is detectable by the first analysis part and then aligns the center of the optical scanning region of the second optical system with the center of the optical scanning region of the first optical system with the target as a reference to the second analysis part and the device arrangement part, and outputs an analysis command that irradiates the semiconductor device with light from at least one of the first analysis part and the second analysis part and receives an electrical signal from the semiconductor device by the electrical signal acquisition part in a state in which a positional relationship between the center of the optical scanning region of the first optical system and the center of the optical scanning region of the second optical system is maintained to the first analysis part, the second analysis part, the electrical signal acquisition part, and the device arrangement part.

In the semiconductor fault analysis device according to the other aspect, the first analysis part may include a first optical detection part that receives light from one side of the semiconductor device, the second analysis part may include a second optical detection part that receives light from the other side of the semiconductor device, and the alignment command may align the center of the scanning region of the first optical system with the center of the scanning region of the second optical system by causing the first optical detection part to acquire a first image of the target from one side, causing the second optical detection part to acquire a second image of the target from the other side, and aligning the optical axis of the second optical system with the optical axis of the first optical system based on the first image and the second image.

In the semiconductor fault analysis device according to the other aspect, the analysis command may cause the chuck to be moved by a third drive part included in the device arrangement part so that the semiconductor device overlaps the optical scanning region of the first optical system and the optical scanning region of the second optical system and then may cause the semiconductor device to be analyzed.

In the semiconductor fault analysis device according to the other aspect, the target may be provided at a position different from a device holding part in which the semiconductor device is held in the chuck.

In the semiconductor fault analysis device according to the other aspect, the first analysis part may include a first optical detection part that receives light from one side of the semiconductor device, the second analysis part may include a second optical detection part that receives light from the other side of the semiconductor device, the first optical detection part may acquire a first image of the target seen from one side, and the second optical detection part may acquire a second image of the target seen from the other side.

In the semiconductor fault analysis device according to the other aspect, the first analysis part may include a first optical detection part that receives light from one side of the semiconductor device, the second analysis part may include a second optical detection part that receives light from the other side of the semiconductor device, and the target may include a light transmission part which transmits light that is detectable by the first optical detection part and the second optical detection part.

A semiconductor fault analysis device according to still another aspect includes a first analysis part in which a semiconductor device is irradiated with light generated by a first light source via a first optical system having a first optical scanning part, and a first optical detection part receives first response light from the semiconductor device generated according to the light of the first light source, a second analysis part in which the semiconductor device is irradiated with light generated by a second light source via a second optical system having a second optical scanning part, and a second optical detection part receives second response light from the semiconductor device generated according to the light of the second light source, a device arrangement part having a chuck disposed between the first analysis part and the second analysis part to hold the semiconductor device and provided with a target that aligns a center of an optical scanning region of the first optical system with a center of an optical scanning region of the second optical system, the chuck being moved relative to the first analysis part and the second analysis part, a stimulus signal application part configured to apply a stimulus signal to the semiconductor device, and a control part configured to output a command to the first analysis part, the second analysis part, the device arrangement part, and the stimulus signal application part. The target is detectable by the first analysis part from one side of the target and is detectable by the second analysis part from the other side of the target. The control part outputs an alignment command that moves the chuck to a position at which the target is detectable by the first optical detection part and then aligns the center of the optical scanning region of the second optical system with the center of the optical scanning region of the first optical system with the target as a reference to the second analysis part and the device arrangement part, and outputs an analysis command that irradiates the semiconductor device with light from at least one of the first analysis part and the second analysis part and receives at least one of the first response light and the second response light from the semiconductor device with at least one of the first optical detection part and the second optical detection part in a state in which a positional relationship between the center of the optical scanning region of the first optical system and the center of the optical scanning region of the second optical system is maintained and the stimulus signal is applied to the semiconductor device to the first analysis part, the second analysis part, the stimulus signal application part, and the device arrangement part.

In the semiconductor fault analysis device according to the still another aspect, the alignment command may align the center of the scanning region of the first optical system with the center of the scanning region of the second optical system by causing the first optical detection part to acquire a first image of the target from one side, causing the second optical detection part to acquire a second image of the target from the other side, and aligning the optical axis of the second optical system with the optical axis of the first optical system based on the first image and the second image.

In the semiconductor fault analysis device according to the still another aspect, the analysis command may cause the chuck to be moved by a third drive part included in the device arrangement part so that the semiconductor device overlaps the optical scanning region of the first optical system and the optical scanning region of the second optical system and then may cause the semiconductor device to be analyzed.

In the semiconductor fault analysis device according to the still another aspect, the target may be provided at a position different from a device holding part in which the semiconductor device is held in the chuck.

In the semiconductor fault analysis device according to the still another aspect, the first optical detection part may acquire a first image of the target seen from one side. The second optical detection part may acquire a second image of the target seen from the other side.

In the semiconductor fault analysis device according to the still another aspect, the target may include a light transmission part which transmits light that is detectable by the first optical detection part and the second optical detection part.

Yet another aspect of the present invention is a semiconductor fault analysis method which analyzes a semiconductor device using a semiconductor fault analysis device. The semiconductor fault analysis device includes a first analysis part in which a first optical detection part receives light emitted by a semiconductor device via a first optical system, and the first optical system is moved relative to the semiconductor device by a first drive part, a second analysis part in which a second optical detection part receives light emitted by the semiconductor device via a second optical system, and the second optical system is moved relative to the semiconductor device by a second drive part, a device arrangement part having a chuck disposed between the first analysis part and the second analysis part to hold the semiconductor device and provided with a target that aligns an optical axis of the first optical system with an optical axis of the second optical system, the chuck being moved relative to the first analysis part and the second analysis part, a stimulus signal application part configured to apply a stimulus signal to the semiconductor device, and a control part configured to output a command to the first analysis part, the second analysis part, the device arrangement part, and the stimulus signal application part. The target is detectable by the first analysis part from one side of the target and is detectable by the second analysis part from the other side of the target. The semiconductor fault analysis method includes an alignment step of moving the chuck to a position at which the target is detectable by the first optical detection part and then aligning the optical axis of the second optical system with the optical axis of the first optical system with the target as a reference, and an analysis step of applying a stimulus signal to the semiconductor device and receiving light from the semiconductor device emitted according to the stimulus signal with at least one of the first optical detection part and the second optical detection part in a state in which a positional relationship between the optical axis of the first optical system and the optical axis of the second optical system is maintained.

The semiconductor fault analysis method according to the yet another aspect may further include a marking step of putting a mark indicating a failure place in the semiconductor device obtained by the first analysis part and the second analysis part on the semiconductor device, after the analysis step.

Yet another aspect is a semiconductor fault analysis method which analyzes a semiconductor device using a semiconductor fault analysis device. The semiconductor fault analysis device includes a first analysis part configured to irradiate a semiconductor device with light generated by a first light source via a first optical system having a first optical scanning part, a second analysis part configured to irradiate the semiconductor device with light generated by a second light source via a second optical system having a second optical scanning part, a device arrangement part having a chuck disposed between the first analysis part and the second analysis part to hold the semiconductor device and provided with a target that aligns a center of an optical scanning region of the first optical system with a center of an optical scanning region of the second optical system, the chuck being moved relative to the first analysis part and the second analysis part, an electrical signal acquisition part configured to receive an electrical signal output by the semiconductor device, and a control part configured to output a command to the first analysis part, the second analysis part, the device arrangement part, and the electrical signal acquisition part. The target is detectable by the first analysis part from one side of the target and is detectable by the second analysis part from the other side of the target. The semiconductor fault analysis method includes an alignment step of moving the chuck to a position at which the target is detectable by the first analysis part and then aligning the center of the optical scanning region of the second optical system with the center of the optical scanning region of the first optical system with the target as a reference, and an analysis step of irradiating the semiconductor device with light from at least one of the first analysis part and the second analysis part and receiving an electrical signal from the semiconductor device by the electrical signal acquisition part in a state in which a positional relationship between the center of the optical scanning region of the first optical system and the center of the optical scanning region of the second optical system is maintained.

The semiconductor fault analysis method according to the yet another aspect may further include a marking step of putting a mark indicating a failure place in the semiconductor device obtained by the first analysis part and the second analysis part on the semiconductor device, after the analysis step.

Yet another aspect of the present invention is a semiconductor fault analysis method which analyzes a semiconductor device using a semiconductor fault analysis device. The semiconductor fault analysis device includes a first analysis part in which a semiconductor device is irradiated with light generated by a first light source via a first optical system having a first optical scanning part, and a first optical detection part receives first response light from the semiconductor device generated according to the light of the first light source, a second analysis part in which the semiconductor device is irradiated with light generated by a second light source via a second optical system having a second optical scanning part, and a second optical detection part receives second response light from the semiconductor device generated according to the light of the second light source, a device arrangement part having a chuck disposed between the first analysis part and the second analysis part to hold the semiconductor device and provided with a target that aligns a center of an optical scanning region of the first optical system with a center of an optical scanning region of the second optical system, the chuck being moved relative to the first analysis part and the second analysis part, a stimulus signal application part configured to apply a stimulus signal to the semiconductor device, and a control part configured to output a command to the first analysis part, the second analysis part, the device arrangement part, and the stimulus signal application part. The target is detectable by the first analysis part from one side of the target and is detectable by the second analysis part from the other side of the target. The semiconductor fault analysis method includes an alignment step of moving the chuck to a position at which the target is detectable by the first optical detection part and then aligning the center of the optical scanning region of the second optical system with the center of the optical scanning region of the first optical system with the target as a reference, and an analysis step of irradiating the semiconductor device with light from at least one of the first analysis part and the second analysis part and receiving at least one of the first response light and the second response light from the semiconductor device with at least one of the first optical detection part and the second optical detection part in a state in which a positional relationship between the center of the optical scanning region of the first optical system and the center of the optical scanning region of the second optical system is maintained and the stimulus signal is applied to the semiconductor device.

The semiconductor fault analysis method according to the yet another aspect may further include a marking step of putting a mark indicating a failure place in the semiconductor device obtained by the first analysis part and the second analysis part on the semiconductor device, after the analysis step.

Advantageous Effects of Invention

According to the present invention, there are provided a semiconductor fault analysis device and a semiconductor fault analysis method for satisfactorily detecting a failure place of a semiconductor device.

BRIEF DESCRIPTION OF DRAWINGS

FIG. 2(a) is a diagram showing a back surface of a laser-marked semiconductor device. FIG. 2(b) is a diagram showing a front surface of the laser-marked semiconductor device. FIG. 2(c) is a cross-sectional view along line II(c)-II(c) of FIG. 2(b).

FIG. 15 is a configuration diagram of the semiconductor fault analysis device of the third embodiment.

FIG. 16 is a flow chart showing a main process in a semiconductor fault analysis method using the analysis device of FIG. 15.

DESCRIPTION OF EMBODIMENTS

Figure 1:
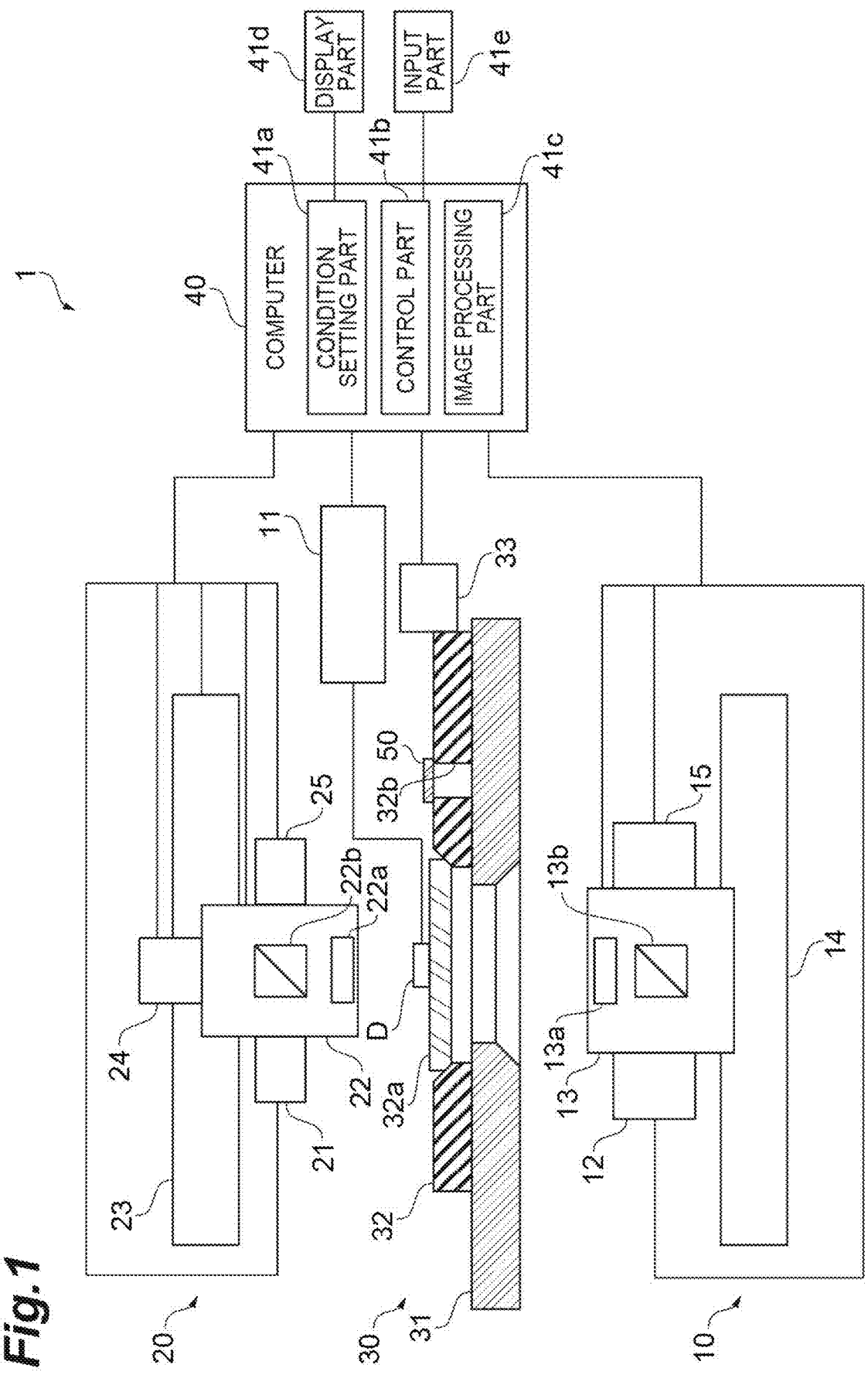
FIG. 1 is a configuration diagram of a semiconductor fault analysis device according to an embodiment.

Incidentally, a technique for analyzing a semiconductor device, when a failure place is identified, there is a technique for marking several places around the failure place by radiating laser light thereto. In a post-process in the fault analysis, the failure place can be easily ascertained based on the mark. Therefore, such a technique is extremely effective.

Japanese Unexamined Patent Publication No. 2016-148550 discloses an analysis device for a semiconductor device. The analysis device disclosed in Patent Literature 1 has a configuration for analyzing a failure place in a semiconductor device and a configuration for putting marks around the failure place. First, the analysis device aligns the configuration for detecting the failure place with the configuration for putting the marks. Next, the analysis device analyzes the failure place while the configuration for detecting the failure place is moved to the semiconductor device. When the configuration for detecting the failure place identifies a position of the failure place, the analysis device moves the configuration for putting the marks to the position of the failure place.

In the post-process of the fault analysis, the position of the failure place is identified based on the mark. Therefore, it is desirable that the mark accurately indicate the position of the failure place. On the other hand, even when a moving mechanism such as an XY stage that moves components of the device has high accuracy, a slight error occurs between a position indicated by a movement command value and an actual position. Even in a case of a slight error, the position of the failure place indicated by the mark may deviate from a position of an actual failure place. That is, the deviation between the actual position of the failure place and the position of the failure place indicated by the mark depends on the accuracy of the moving mechanism.

An object of the present invention is to provide a semiconductor fault analysis device and a semiconductor fault analysis method capable of reducing deviation between a position of a failure place and a position of a failure place indicated by a mark.

A semiconductor fault analysis device according to an aspect of the present invention includes an analysis part in which a first optical detection part receives first light from a semiconductor device via a first optical system, and the first optical system is moved relative to the semiconductor device by a first drive part, a marking part in which a second optical detection part receives second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part. The target is detectable by the first optical detection part from one side of the target and is detectable by the second optical detection part from the other side of the target. The control part outputs an alignment command that moves the chuck to a position at which the target is detectable by the first optical detection part and then aligns the optical axis of the second optical system with the optical axis of the first optical system with the target as a reference to the marking part and the device arrangement part, and outputs a marking command that irradiates a marking position set on the semiconductor device with the laser light in a state in which a positional relationship between the optical axis of the first optical system and the optical axis of the second optical system is maintained to the marking part and the device arrangement part.

Another aspect of the present invention is a semiconductor fault analysis method which analyzes a semiconductor device using a semiconductor fault analysis device. The semiconductor fault analysis device includes an analysis part in which a first optical detection part receives first light from a semiconductor device via a first optical system, and the first optical system is moved relative to the semiconductor device by a first drive part, a marking part in which a second optical detection part receives second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part. The target is detectable by the first optical detection part from one side of the target and is detectable by the second optical detection part from the other side of the target. The semiconductor fault analysis method includes an alignment step of moving the chuck to a position at which the target is detectable by the first optical detection part and then aligning the optical axis of the second optical system with the optical axis of the first optical system with the target as a reference, and a marking step of irradiating a marking position set on the semiconductor device with the laser light in a state in which a positional relationship between the optical axis of the first optical system and the optical axis of the second optical system is maintained.

In the semiconductor fault analysis device and the semiconductor fault analysis method, first, the optical axis of the second optical system included in the marking part is aligned with the optical axis of the first optical system included in the analysis part based on the target provided in the chuck. Then, the marking position set in the semiconductor device is irradiated with laser light in a state in which a positional relationship between the optical axis of the first optical system and the optical axis of the second optical system is maintained. That is, after the optical axis of the first optical system and the optical axis of the second optical system are aligned with each other, one of the first optical system and the second optical system does not move relative to the other. Therefore, there is no deviation between a position indicated by a movement command value which may occur due to movement and an actual position. As a result, it is possible to reduce a deviation of a position of the failure place indicated by a mark with respect to a position of the failure place indicated by the analysis part.

In the semiconductor fault analysis device according to one aspect, the control part may output an analysis command that analyzes a failure place in the semiconductor device with the analysis part to the analysis part before the alignment command is output. Similarly, the semiconductor fault analysis method according to another aspect may further include an analysis step of analyzing a failure place in the semiconductor device 11 with the analysis part before the alignment step. With such a configuration, it is possible to put a mark indicating the position of a failure place with high accuracy.

In the semiconductor fault analysis device according to one aspect, the marking command may cause the chuck to be moved to the marking position by the third drive part and then may cause the semiconductor device to be irradiated with the laser light. Similarly, in the semiconductor fault analysis method according to another aspect, the marking step may cause the chuck to be moved to the marking position by the third drive part and then may cause the semiconductor device to be irradiated with the laser light. With such a configuration, after the optical axis of the second optical system is aligned with the optical axis of the first optical system, it is possible to irradiate a desired position on the semiconductor device with the laser light in a state in which an absolute position in addition to the relative position of the first optical system and the second optical system is maintained. As a result, it is possible to further reduce the deviation of the position of the failure place indicated by the mark put by the marking part.

In the semiconductor fault analysis device according to one aspect, the alignment command may cause the first optical detection part to acquire a first image of the target from one side, may cause the second optical detection part to acquire a second image of the target from the other side, and may move the second drive system so that the optical axis of the second optical system is aligned with the optical axis of the first optical system based on the first image and the second image. Similarly, in the semiconductor fault analysis method according to another aspect, the alignment step may cause the first optical detection part to acquire a first image of the target from one side, may cause the second optical detection part to acquire a second image of the target from the other side, and may move the second optical system so that the optical axis of the second optical system is aligned with the optical axis of the first optical system based on the first image and the second image. With such a configuration, an operation in which the optical axis of the second optical system is aligned with the optical axis of the first optical system can be reliably performed.

In the semiconductor fault analysis device according to one aspect, the target may be provided at a position different from a device holding part in which the semiconductor device is held in the chuck. With such a configuration, the optical axis of the second optical system can be aligned with the optical axis of the first optical system regardless of a type of the semiconductor device.

In the semiconductor fault analysis device according to one aspect, the first optical detection part may acquire a first image of the target seen from one side, and the second optical detection part may acquire a second image of the target seen from the other side. With such a configuration, the operation in which the optical axis of the second optical system is aligned with the optical axis of the first optical system can be reliably performed.

In the semiconductor fault analysis device according to one aspect, the target may include a light transmission part which transmits light that is detectable by the first optical detection part and the second optical detection part. With such a configuration, the operation in which the optical axis of the second optical system is aligned with the optical axis of the first optical system can be reliably performed.

According to the present invention, there is provided a semiconductor fault analysis device and a semiconductor fault analysis method capable of reducing a deviation between a position of a failure place and a position indicated by a mark.

Hereinafter, embodiments for implementing the present invention will be described in detail with reference to the accompanying drawings. In the description of the drawings, the same elements are designated by the same reference numerals, and duplicate description thereof will be omitted.

As shown in FIG. 1, a semiconductor fault analysis device according to the present embodiment analyzes a semiconductor device D which is a device under test (DUT). In the following description, the semiconductor fault analysis device according to the present embodiment is simply referred to as "analysis device 1". Further, the analysis of the semiconductor device D includes, for example, identification of a position of a failure place included in the semiconductor device D. The analysis of the semiconductor device D is not limited to identifying the position of the failure place. The analysis of the semiconductor device D includes other analyzes, inspections and the like relating to the semiconductor device D. Hereinafter, the analysis device 1 of the present embodiment will be described as one that identifies the position of the failure place included in the semiconductor device D.

Further, the analysis device 1 identifies the position of the failure place and puts a seal (a mark) indicating the failure place around the failure place. An operation of putting the mark is referred to as "marking". The mark is for easily ascertaining the failure place identified by the analysis device 1 in a post-process of the fault analysis.

Examples of the semiconductor device D include a logic device that is an integrated circuit (IC) having a PN junction such as a transistor or a large-scale integration (LSI), a memory device, an analog device, a mixed signal device that is a combination thereof, a power semiconductor device (a power device) such as a high-current/high-voltage MOS transistor, a bipolar transistor, and an IGBT, and the like. The semiconductor device D has a laminated structure including a substrate and a metal layer. As the substrate of the semiconductor device D, for example, a silicon substrate is used.

The analysis device 1 includes an analysis part 10, a marking part 20, a device arrangement part 30, and a computer 40. The analysis part 10 identifies the failure place in the semiconductor device D. The marking part 20 put a mark indicating the position of the failure place. The semiconductor device D is disposed in the device arrangement part 30. The analysis device 1 may be, for example, an inverted emission microscope having a laser marking function.

<Analysis Part>

The analysis part 10 includes a tester unit 11, a light source 12 (a first light source), an observation optical system 13 (a first optical system), an XYZ stage 14 (a first drive part), and a two-dimensional camera 15 (a first optical detection part).

The tester unit 11 is electrically connected to the semiconductor device D via a cable. The tester unit 11 is a stimulus signal application part that applies a stimulus signal to the semiconductor device D. The tester unit 11 is operated by a power source (not shown). The tester unit 11 repeatedly applies a stimulus signal such as a predetermined test pattern to the semiconductor device D. The stimulus signal output by the tester unit 11 may be a modulated current signal or a continuous wave (CW) current signal.

The tester unit 11 is electrically connected to the computer 40 via a cable. The tester unit 11 applies a stimulus signal designated by the computer 40 to the semiconductor device D. The tester unit 11 does not necessarily have to be electrically connected to the computer 40. When the tester unit 11 is not electrically connected to the computer 40, the tester unit 11 determines a stimulus signal such as a test pattern by itself. A power supply, a pulse generator, or the like may be used as the tester unit 11.

The light source 12 outputs light to the semiconductor device D. The light source 12 may be, for example, a light emitting diode (LED) or a super luminescent diode (SLD). Further, the light source 12 may be an incoherent light source such as a lamp light source or a coherent light source such as laser light source. The light output from the light source 12 passes through the substrate of the semiconductor device D. For example, when the substrate of the semiconductor device D is made of silicon, a wavelength of the light output from the light source 12 is preferably 1064 nm or more. The light output from the light source 12 is provided to the observation optical system 13.

The observation 1 optical system 13 outputs the light output from the light source 12 to the semiconductor device D. For example, the light source 12 irradiates a back surface D1 side of the semiconductor device D with light during a marking process. The observation optical system 13 includes an objective lens 13a and a beam splitter 13b. The objective lens 13a collects light in an observation area.

The observation optical system 13 guides light reflected by the semiconductor device D to the two-dimensional camera 15. Specifically, the light emitted from the observation optical system 13 passes through a substrate SiE of the semiconductor device D (refer to FIG. 2(c)). Next, the light transmitted through the substrate SiE is reflected by a metal layer ME (refer to FIG. 2(c)). Next, the light reflected from the metal layer ME passes through the substrate SiE again. Then, the light transmitted through the substrate SiE is input to the two-dimensional camera 15 via the objective lens 13a and the beam splitter 13b of the observation optical system 13. Further, the observation optical system 13 guides emission light generated from the semiconductor device D by the application of the stimulus signal to the two-dimensional camera 15. Specifically, the metal layer ME of the semiconductor device D may emit light such as emission light due to the application of a stimulus signal. The light emitted by the metal layer ME is transmitted through the substrate SiE and then input to the two-dimensional camera 15 via the objective lens 13a and the beam splitter 13b of the observation optical system 13.

The observation optical system 13 is mounted on the XYZ stage 14. A Z-axis direction is an optical axis direction of the objective lens 13a. The XYZ stage 14 is movable in the Z-axis direction. Further, the XYZ stage 14 can move in an X-axis direction and a Y-axis direction orthogonal to the Z-axis direction. The XYZ stage 14 is controlled by a control part 41b of the computer 40 which will be described below. An observation area is determined by a position of the XYZ stage 14. The observation optical system 13 guides reflected light from the semiconductor device D according to the irradiated light to the two-dimensional camera 15 as light from the semiconductor device D.

The two-dimensional camera 15 receives the light (first light) from the semiconductor device D. The two-dimensional camera 15 outputs image data based on the received light. The light from the semiconductor device D referred to in the specification may be reflected light reflected by the semiconductor device D according to the illumination light. Further, the light from the semiconductor device D referred to in the specification may be emission light generated in response to a stimulus signal. For example, the two-dimensional camera 15 takes an image of the semiconductor device D from the substrate SiE side of the semiconductor device D during the marking process. In other words, the two-dimensional camera 15 takes an image of the semiconductor device D from the back surface D1 side of the semiconductor device D during the marking process.

The two-dimensional camera 15 receives the light reflected by the semiconductor device D. Then, the two-dimensional camera 15 outputs image data for creating a pattern image to the computer 40 based on the received light. A marking position can be ascertained by the pattern image. Further, the two-dimensional camera 15 receives the emission light generated in response to the stimulus signal. The two-dimensional camera 15 outputs image data for generating a light emission image to the computer 40 based on the received light. According to the light emission image, a light emission place in the semiconductor device D can be identified. A failure place in the semiconductor device D can be identified by identifying the light emission place.

An image pickup device capable of detecting light having a wavelength transmitted through the substrate SiE of the semiconductor device D may be used as the two-dimensional camera 15. A camera equipped with a charge coupled device (CCD) image sensor or a complementary metal oxide semiconductor (CMOS) image sensor may be adopted as the two-dimensional camera 15. An InGaAs camera, an MCT camera, or the like may be adopted as the two-dimensional camera 15. Illumination light from the light source 12 is unnecessary when the light emission is measured. That is, it is not necessary to operate the light source 12 when the light emission is measured.

<Marking Part>

Next, the marking part 20 will be described. The marking part 20 puts a mark indicating a failure place. The marking part 20 includes laser light source 21, a laser marking optical system 22 (a second optical system), an XYZ stage 23 (a second drive part), a probing camera 24 (a second optical detection part), and an illumination light source 25.

Figure 2:
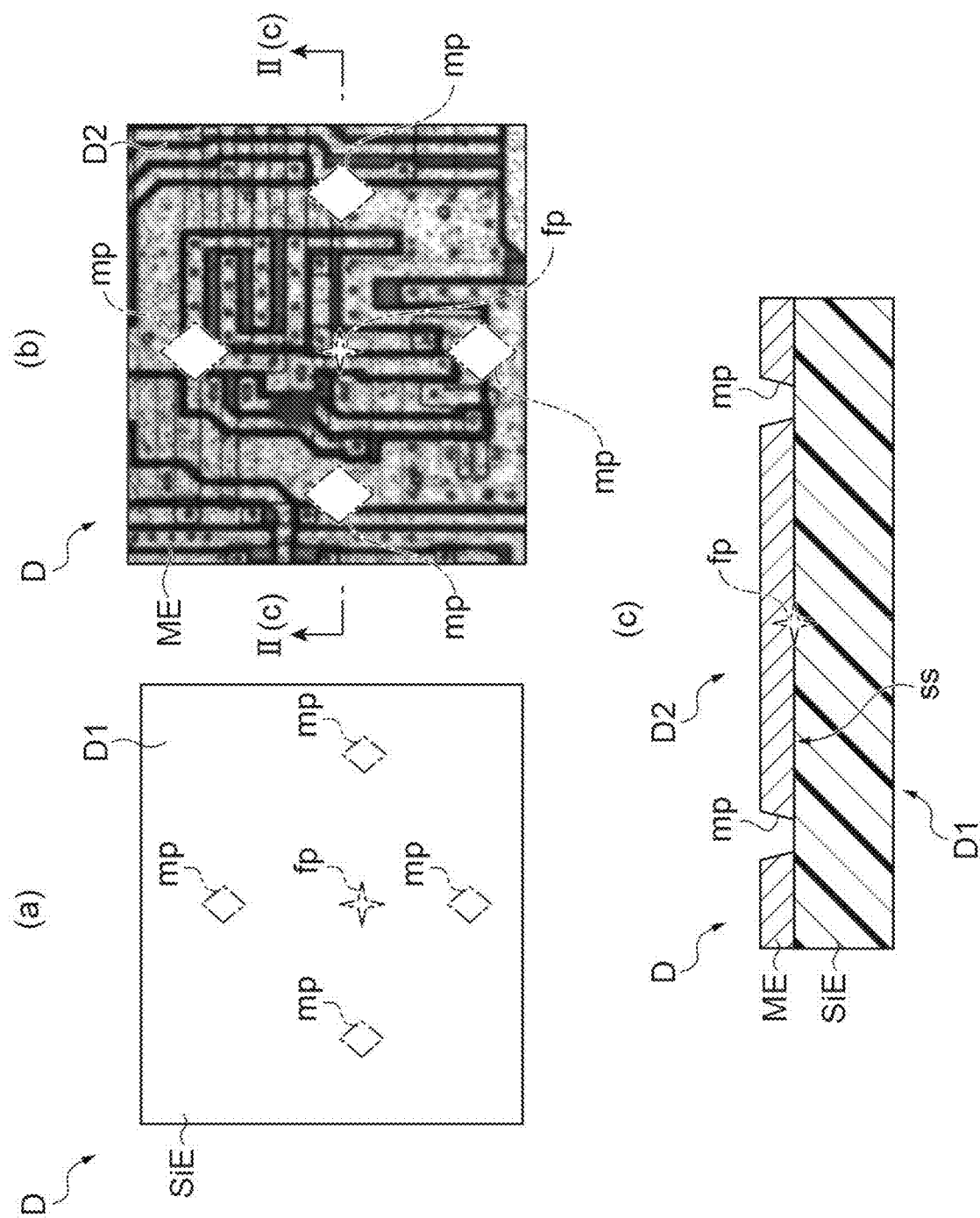
FIG. 2 is a diagram for describing a laser marking image on a semiconductor device.

The marking part 20 puts a mark around the failure place identified by the analysis part 10. As shown in FIGS. 2(a) and 2(b), marking places mp are set around a failure place fp. In FIGS. 2(a) and 2(b), four marking places mp are shown. In a state in which the laser marking is completed, as shown in FIG. 2(c), a through hole that passes through the metal layer ME of the semiconductor device D is formed. The laser marking is performed to an extent that the through hole reaches a boundary surface ss between the metal layer ME and the substrate SiE and thus a surface of the substrate SiE in contact with the metal layer ME is exposed. That is, the "mark" referred to in the specification may be a through hole formed in the metal layer ME. Further, the "mark" referred to in the present specification may be the substrate SiE exposed from the through hole.

Figure 3:
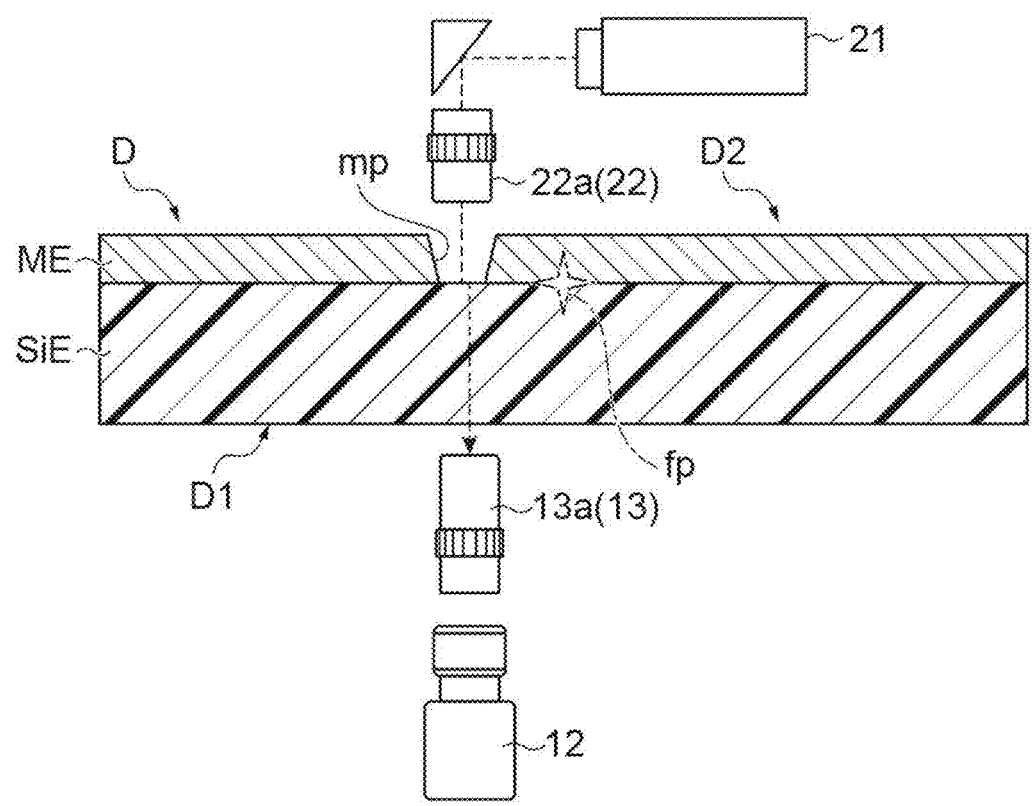
FIG. 3 is a diagram for describing marking control in the analysis device of FIG. 1.

As shown in FIG. 3, the marking part 20 irradiates the marking place mp on the semiconductor device D with the laser light output by the laser light source 21 via the laser marking optical system 22. The marking part 20 irradiates the marking place mp with the laser light from the metal layer ME side of the semiconductor device D. Hereinafter, the details of the marking part 20 will be described As shown in FIG. 1, the laser light source 21 outputs the laser light radiated to the semiconductor device D. The laser light forms a through hole in the metal layer ME. The laser light source 21 starts an output of the laser light when an output start command is input from the computer 40. For example, a solid-state laser light source, a semiconductor laser light source, or the like may be adopted as the laser light source 21. A wavelength of the light output from the laser light source 21 is 250 nm or more and 2000 nm or less.

The laser marking optical system 22 irradiates the marking place mp on the semiconductor device D with the laser light. Specifically, the laser marking optical system 22 irradiates the semiconductor device D with the laser light from the metal layer ME side of the semiconductor device D. In other words, the laser marking optical system 22 irradiates the semiconductor device D with the laser light from the front surface D2 side of the semiconductor device D. The laser marking optical system 22 has an objective lens 22a and a switching part 22b. The switching part 22b switches an optical path of the laser light source 21 and the probing camera 24. The objective lens 22a concentrates the laser light on the marking place mp. The objective lens 22a guides the light coining from the surface of the semiconductor device D to the probing camera 24.

The laser marking optical system 22 is mounted on the XYZ stage 23. The Z-axis direction of the XYZ stage 23 is an optical axis direction of the objective lens 22a. The XYZ stage 23 receives a control command from the computer 40. The XYZ stage 23 moves the laser marking optical system 22 in the Z-axis direction according to a control command. Further, the XYZ stage 23 moves the laser marking optical system 22 in the X-axis direction and the Y-axis direction orthogonal to the Z-axis direction according to a control command. Further, the laser marking optical system 22 may have an optical scanning part that replaces the XYZ stage 23 and may concentrate the laser light on the marking place mp on the front surface D2 of the semiconductor device D. An optical scanning element such as a galvano mirror or a MEMS mirror may be used as the optical scanning part. Further, the laser marking optical system 22 may include a shutter. With such a configuration, the laser light from the laser light source 21 under the control of the control part 41b is passed or blocked by the shutter. As a result, the output of the laser light can be controlled.

The probing camera 24 takes an image of the metal layer ME of the semiconductor device D from the front surface D2 side of the semiconductor device D. The probing camera 24 outputs the captured image to the computer 40. A user can ascertain a state of laser marking as seen from the front surface D2 side of the semiconductor device D by checking the captured image. The illumination light source 25 illuminates the semiconductor device D with illumination light when the probing camera 24 takes an image.

<Device Arrangement Part>

The device arrangement part 30 holds the semiconductor device D. Further, the device arrangement part 30 changes a position of the semiconductor device D with respect to the observation optical system 13. Similarly, the device arrangement part 30 changes the position of the semiconductor device D with respect to the laser marking optical system 22. The device arrangement part 30 includes a sample stage 31, a wafer chuck 32, and an XY drive part 33 (a third drive part).

Therefore, the analysis device 1 includes a drive mechanism for each of the observation optical system 13, the laser marking optical system 22, and the device arrangement part 30. That is, the analysis device 1 has three degrees of freedom. According to the configuration having three degrees of freedom, for example, the laser marking optical system 22 and the device arrangement part 30 can be moved in a state in which the observation optical system 13 is fixed. Further, the device arrangement part 30 can be moved in a state in which the observation optical system 13 and the laser marking optical system 22 are fixed. The term "fixed" means that the position is not changed. For example, the "state in which the observation optical system 13 and the laser marking optical system 22 are fixed" means a state in which a relative position of the laser marking optical system 22 with respect to the observation optical system 13 is maintained.

A wafer chuck 32 is slidably mounted on the sample stage 31. The wafer chuck 32 has a device holding part 32a for holding the semiconductor device D. The device holding part 32a includes a through hole provided in the wafer chuck 32 and a glass plate that physically closes the through hole.

Figure 4:
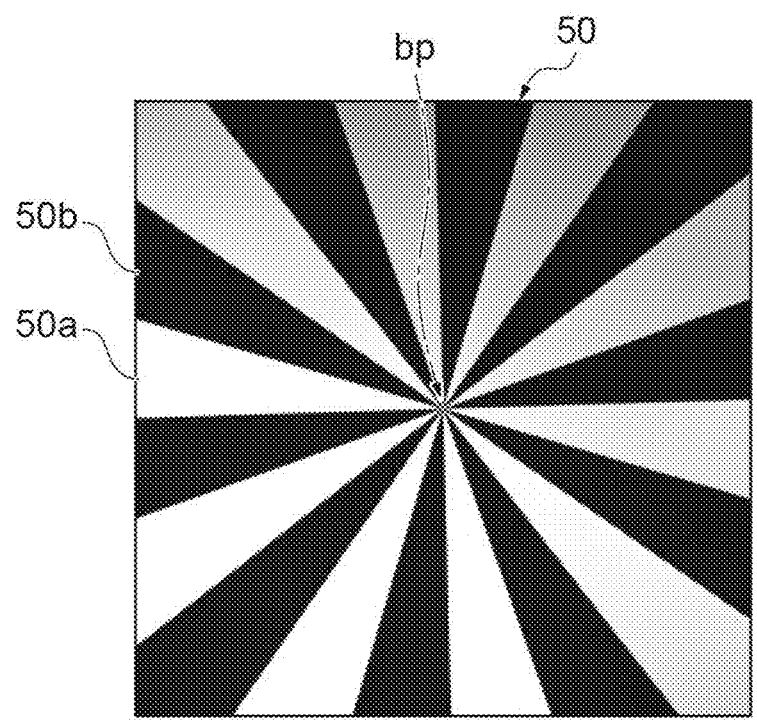
FIG. 4 is a view showing a target in a plan view.

The wafer chuck 32 has an alignment target 50. The alignment target 50 (refer to FIG. 4) is a glass plate. A pattern that extends radially around a reference point bp is provided on one surface of the glass plate. This pattern is configured of, for example, a metal film. As an example, the pattern is created by a thin film of aluminum. Therefore, the pattern constitutes an opaque part 50b. The glass plate transmits the light having a wavelength that passes through the substrate SiE of the semiconductor device D. As a result, the glass plate also transmits the light output from the illumination light source 25 and the light source 12. Therefore, a region in which the pattern is not provided constitutes a light transmission part 50a. The wafer chuck 32 has a target hole 32b in which the alignment target 50 is disposed. The alignment target 50 is disposed to close the target hole 32b. According to such an arrangement, the probing camera 24 and the two-dimensional camera 15 can acquire an image of the pattern provided on one surface of the glass plate.

The alignment target 50 is provided on the wafer chuck 32. That is, in the wafer chuck 32, a position at which the device holding part 32a is provided is different from a position in which the alignment target 50 is provided. When the position of the wafer chuck 32 is changed by the XY drive part 33, the position of the semiconductor device D and the position of the alignment target 50 are changed at the same time. That is, the position of the alignment target 50 with respect to the semiconductor device D attached to the wafer chuck 32 is unchanged.

The XY drive part 33 moves the wafer chuck 32 in the X-axis direction or the Y-axis direction according to a control command from the computer 40. As a result, the observation area can be changed without moving the observation optical system 13. Similarly, the irradiation position of the laser light can be changed without moving the laser marking optical system 22.

The specific configuration of the device arrangement part 30 is not limited to the above configuration. The device arrangement part 30 may adopt a configuration that has a function of holding the semiconductor device D and a function of moving the semiconductor device D in at least one of the X-axis direction and the Y-axis direction. For example, instead of the sample stage 31 and the XY drive part 33, there may be provided an XY stage that moves the wafer chuck 32 in at least one of the X-axis direction and the Y-axis direction.

<Computer>

The computer 40 is a computer such as a personal computer. The computer 40 is physically configured to include a memory such as a RAM and a ROM, a processor (an arithmetic circuit) such as a CPU, a communication interface, and a storage part such as a hard disk. Examples of the computer 40 include a personal computer, a cloud server, a smart device (a smart phone, a tablet terminal, and the like) and the like. The computer 40 functions by executing a program stored in the memory on the CPU of a computer system. The computer 40 includes a condition setting part 41a, a control part 41b, and an image processing part 41c as functional components.

<Condition Setting Part>

The condition setting part 41a sets the marking place mp based on information indicating the failure place fp input from an input part 41e. Several marking places mp are set around the identified failure place fp. The several places are, for example, four places. For example, when the information indicating a failure place fp is input, the condition setting part 41a automatically sets the marking places mp centering on the failure place fp at four positions around the failure place fp. Specifically, the condition setting part 41a sets the marking places mp in a cross shape centering on the failure place fp, for example, in a plan view (refer to FIGS. 2(a) and 2(b)). The marking places mp may be set by the input part 41e accepting an input of the information indicating the marking place mp from the user who has seen an analysis image displayed on a display part 41d. In this case, the condition setting part 41a does not automatically set the marking place mp. The condition setting part 41a sets the marking place mp based on the information indicating the marking place mp input from the input part 41e. The condition setting part 41a generates a reference image. The reference image is obtained by adding a mark indicating the failure place fp and a mark indicating the marking place mp to the analysis image. The condition setting part 41a saves the reference image in the memory of the computer 40.

<Control Part>

The control part 41b controls the XYZ stage 14 of the analysis part 10 so that the observation area of the failure place enters the field of view of the two-dimensional camera 15. The control part 41b controls the XYZ stage 23 of the marking part 20 so that the optical axis of the laser marking optical system 22 coincides with the optical axis of the observation optical system 13. The control part 41b controls the XY drive part 33 of the device arrangement part 30 so that the optical axis of the laser marking optical system 22 overlaps the marking place mp.

The control part 41b also controls the laser light source 21. When the image processing part 41c determines that a mark image has appeared, the control part 41b outputs an output stop signal to the laser light source 21. The laser light source 21 stops an output of the laser light when the output stop signal is input. Therefore, the laser light source 21 continues to output the laser light from the input of the output start signal to the input of the output stop signal by the control part 41b. From the above, the control part 41b controls the laser light source 21 so that the laser marking is performed until the mark image formed by the laser marking appears in the pattern image. Further, since a penetration threshold value of the laser light is set, the control part 41b controls the laser light source 21 so that the laser marking is performed until the laser light penetrates the metal layer ME.

<Image Processing Part>

The computer 40 is electrically connected to the two-dimensional camera 15 via a cable. The computer 40 creates a pattern image and a light emission image using the image data input from the two-dimensional camera 15. Here, it is difficult to identify a light emitting position in the pattern of the semiconductor device D only with the above-described light emission image. Therefore, the computer 40 generates, as an analysis image, an overlapping image in which a pattern image based on the reflected light from the semiconductor device D and a light emission image based on the light emitted from the semiconductor device D overlap each other.

The image processing part 41c creates a marking image. In the marking image, a pattern image including the mark image and a light emission image overlap each other. The created marking image is stored in the memory of the computer 40. Further, the image processing part 41c displays the marking image on the display part 41d. The marking image allows the user to accurately ascertain the marking position with respect to the position of the failure place in the subsequent process. Further, the image processing part 41c acquires marking information. The marking information is information necessary for ascertaining the marking position with respect to the position of the failure place. Examples of the marking information include a distance from the marking position to the position of the failure place, an orientation of the marking position based on the position of the failure place, and the like. The acquired marking information may be displayed as a list. Further, the marking information may be added to and displayed in the marking image. Further, the marking information may be output on a paper medium.

The computer 40 outputs the analysis image to the display part 41d. The display part 41d is a display device such as a display for showing the analysis image or the like to the user. The user can confirm the position of the failure place from the analysis image displayed on the display part 41d. Further, the user inputs the information indicating the failure place using the input part 41e. The input part 41e is an input device such as a keyboard and a mouse that receives an input from the user. The input part 41e outputs the information indicating the failure place to the computer 40. The computer 40, the display part 41d, and the input part 41e may be tablet terminals.

The image processing part 41c may output a control command for stopping the irradiation of the laser light to the control part 41b. The control command for stopping the irradiation of the laser light is generated using the mark image appearing in the pattern image. Specifically, the image processing part 41c sequentially generates the pattern image in parallel with the laser marking by the laser light output from the laser light source 21. Due to the laser marking, a hole is formed in the metal layer ME corresponding to the marking place mp. When the hole of the metal layer ME is shallow, a change in the intensity of the reflected light at the marking position is small, and a change in an optical reflection image is also small. In other words, when the hole formed by the laser marking is formed only in the metal layer ME and does not reach the substrate SiE, the change in the intensity of the reflected light at the marking position is small. Therefore, the change in the optical reflection image is also small. As a result, an effect of the laser marking does not appear in the pattern image. On the other hand, when the hole of the metal layer ME becomes deeper, a change in at least one of a refractive index, a transmittance, and a reflectance of the light on the back surface D1 side becomes large. Specifically, when the hole becomes deep enough to reach a boundary surface ss between the metal layer ME and the substrate SiE, the change in at least one of the refractive index, the transmittance, and the reflectance of the light on the back surface D1 side becomes large. Due to such a change, the change in the intensity of the reflected light at the marking position becomes large. As a result, the mark image indicating the marking place appears in the pattern image.

The image processing part 41c compares, for example, the above-described reference image with the pattern image. As a result of the comparison, when a difference between the images is larger than a predetermined value, the image processing part 41c determines that the mark image has appeared. It is possible to determine a timing at which it is determined that the mark image has appeared by setting the predetermined value in advance.

The image processing part 41c may determine whether or not the mark image has appeared according to an input content from the user. Further, the image processing part 41c compares the reference image with the pattern image when it is determined that the mark image has appeared. Then, when a mark forming place in the pattern image deviates from the marking place mp in the reference image, the image processing part 41c may determine that a mark position deviation has occurred. In this case, the laser marking may be performed again so that the mark is formed at a correct marking place mp.

Figure 5:
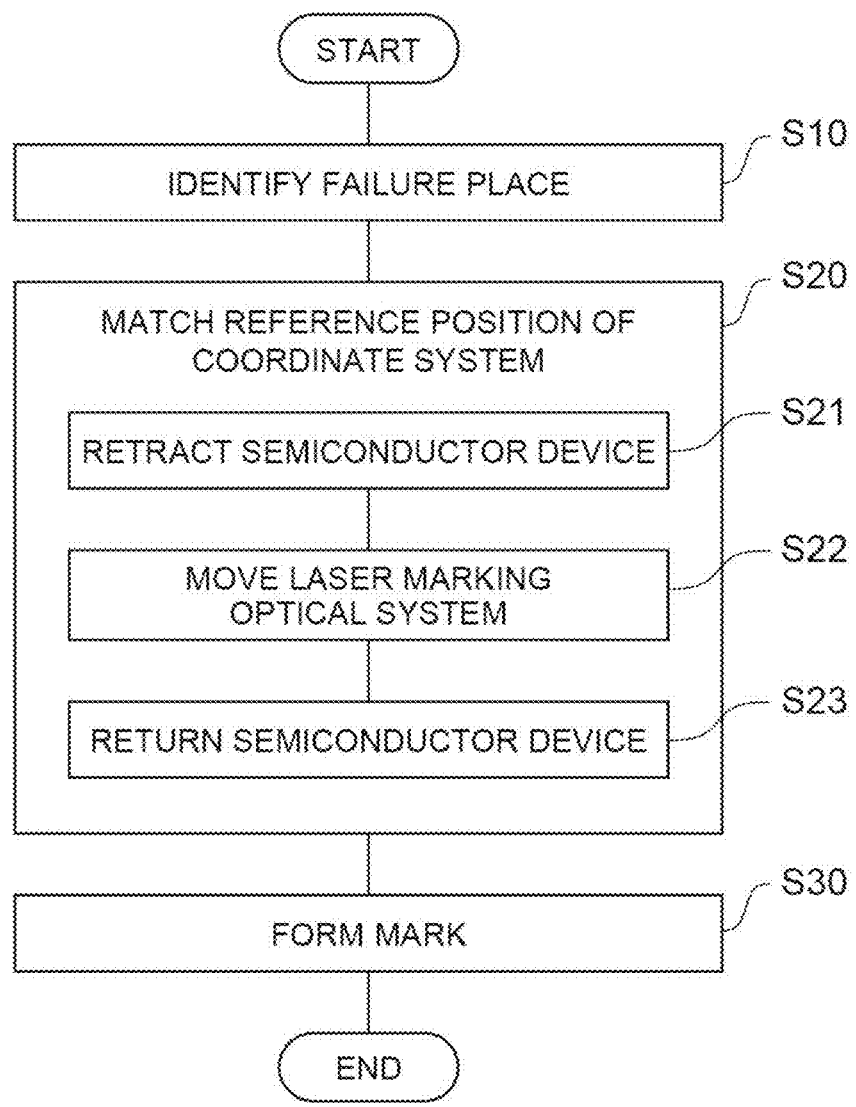
FIG. 5 is a flow chart showing main steps of a semiconductor fault analysis method using the analysis device of FIG. 1.
Figure 6:
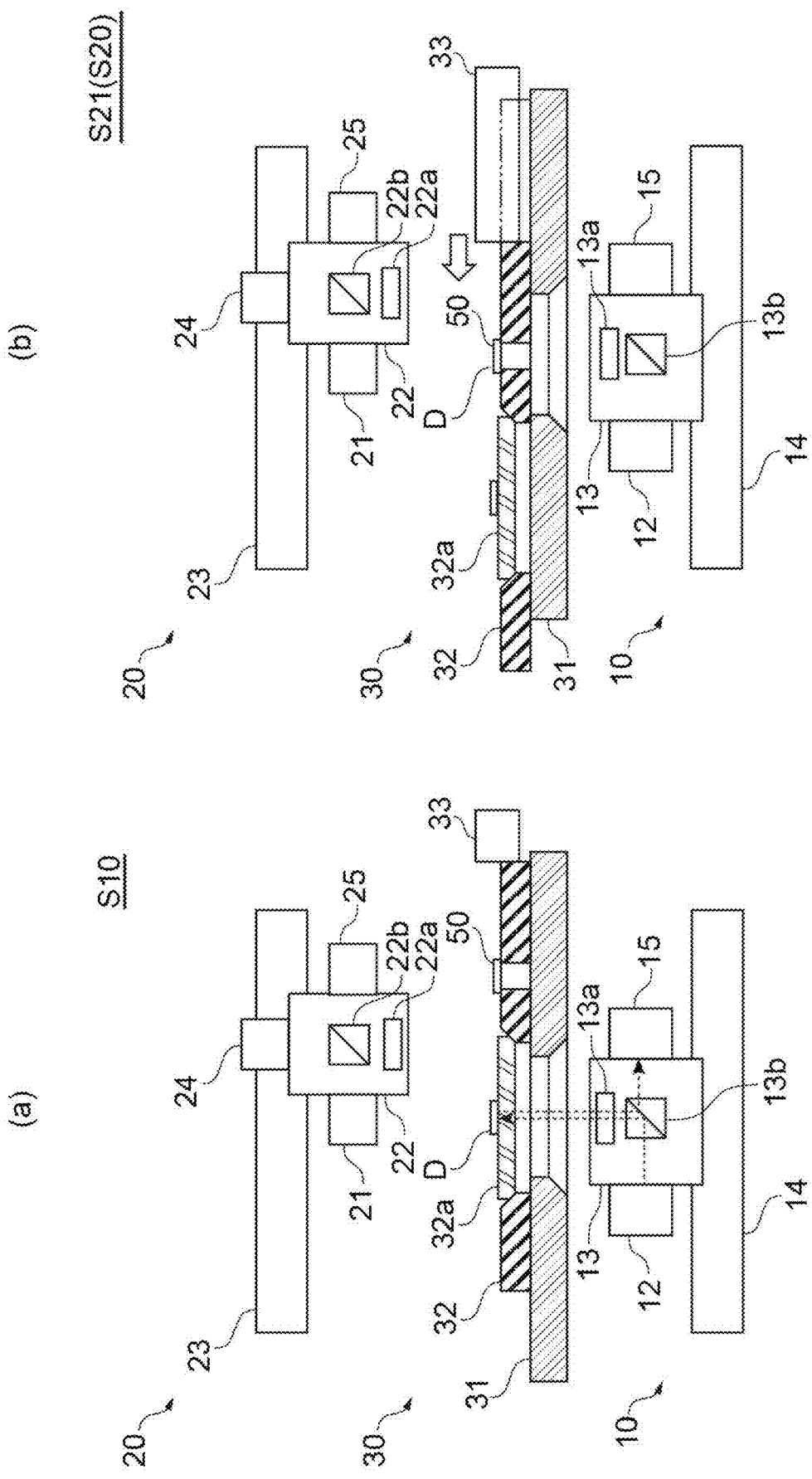
FIG. 6(a) is a diagram showing an analysis step.
FIG. 6(b) is a diagram showing one step constituting an alignment step.
Figure 7:
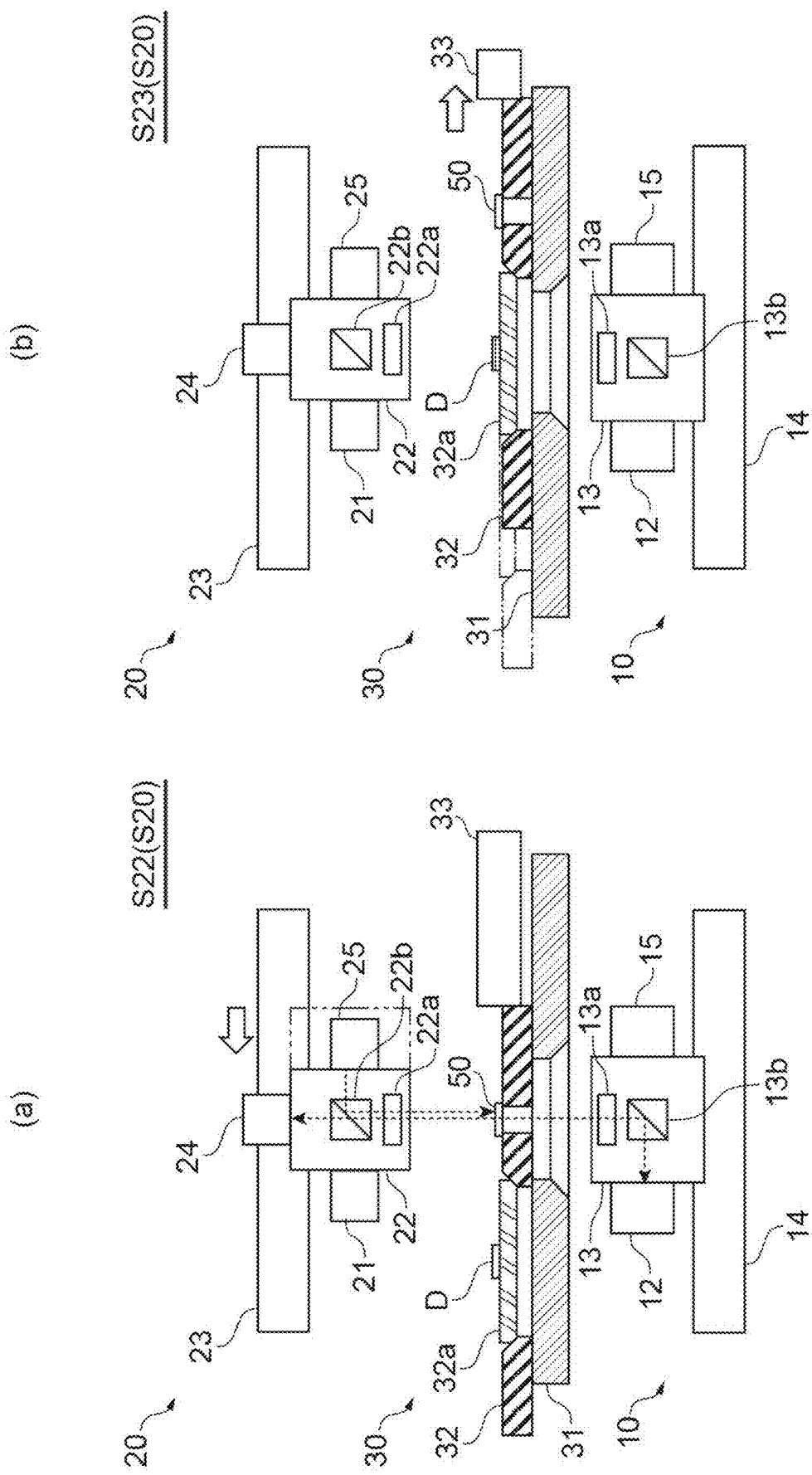
FIG. 7(a) is a diagram showing one step constituting the alignment step following FIG. 6(b).
FIG. 7(b) is a diagram showing one step constituting the alignment step following FIG. 7(a).

Next, marking processing of the analysis device 1 will be described with reference to FIGS. 5 to 8. FIG. 5 is a flow chart showing a main process in the marking step of the analysis device 1.

<Analysis Step S10>

First, the failure place in the semiconductor device D is identified (S10). The control part 41b outputs an analysis command for step S10 to the analysis part 10. Specifically, as shown in FIG. 6(a), the XYZ stage 14 controls the X-axis direction and the Y-axis direction to move the observation optical system 13 to capture an area to be observed in the field of view of the observation optical system 13. Next, the observation optical system 13 is moved by controlling the Z-axis direction of the XYZ stage 14 so that a focal position of the objective lens 13a is aligned with the area to be observed. Next, the light source 12 irradiates the semiconductor device D with light. Then, the two-dimensional camera 15 receives the reflected light from the semiconductor device D. The two-dimensional camera 15 generates an optical reflection image based on the reflected light. Then, the two-dimensional camera 15 outputs the optical reflection image to the computer 40. After the optical reflection image is output, the light source 12 stops irradiating the semiconductor device D with light. Subsequently, the tester unit 11 applies a stimulus signal to the semiconductor device D. Then, the two-dimensional camera 15 receives the light caused by the stimulus signal. The two-dimensional camera 15 generates a light emission image based on the light caused by the stimulus signal. Then, the two-dimensional camera 15 outputs the light emission image to the computer 40. The image processing part 41c generates an analysis image in which the optical reflection image and the light emission image overlap each other. Next, the failure place fp is identified using the analysis image.

As described above, in a period during which the analysis step is being performed, a positional relationship of the observation optical system 13 with respect to the semiconductor device D includes an observation area in the field of view of the observation optical system 13. Then, the positional relationship of the observation optical system 13 with respect to the semiconductor device D is maintained during the period during which the analysis step is being performed. On the other hand, the position of the laser marking optical system 22 with respect to the semiconductor device D is not particularly limited during the period during which the analysis step is being performed. For example, the optical axis of the laser marking optical system 22 may or may not coincide with the optical axis of the observation optical system 13. Normally, the optical axis of the laser marking optical system 22 does not coincide with the optical axis of the observation optical system 13 unless alignment of the optical axis is performed. In the analysis method of the present embodiment, the alignment of the optical axis is performed before the above-described analysis step, but it is not essential. In the analysis method of the present embodiment, the alignment of the optical axis is performed after the analysis step is completed.

<Alignment Step S20>

Next, the alignment between the observation optical system 13 and the laser marking optical system 22 is performed (S20). The control part 41b outputs an alignment command for step S20 to the marking part 20 and the device arrangement part 30. In the following description, a state in which the optical axis of the observation optical system 13 intersects the failure place in the semiconductor device D immediately before the alignment step is performed is exemplified. First, as shown in FIG. 6(b), the XY drive part 33 controls the X-axis direction and the Y-axis direction to move the wafer chuck 32 so that the alignment target 50 is captured in the field of view of the observation optical system 13 (S21). This movement is also referred to as "retraction of the semiconductor device D". At this time, the control part 41b stores a movement amount of the semiconductor device D (the wafer chuck 32).

Next, as shown in FIG. 7(a), the XYZ stage 23 controls the X-axis direction and the Y-axis direction to move the laser marking optical system 22 so that the alignment target 50 is captured in the field of view of the laser marking optical system 22 (S22). Next, the illumination light source 25 outputs the illumination light toward the alignment target 50. The illumination light passes through the light transmission part 50a of the alignment target 50 and is incident on the observation optical system 13. The incident illumination light is captured by the two-dimensional camera 15. The two-dimensional camera 15 outputs a transmission image to the computer 40. Further, the illumination light is reflected by the opaque part 50b of the alignment target 50. The reflected light is incident on the laser marking optical system 22 again. Then, the incident reflected light is captured by the probing camera 24. The probing camera 24 outputs a reflection image to the computer 40. The image processing part 41c calculates a deviation of the optical axis of the laser marking optical system 22 with respect to the optical axis of the observation optical system 13 using the transmission image and the reflection image. The movement of the laser marking optical system 22 and the confirmation of the deviation amount are repeated until the deviation is within an allowable range. When it is determined that the deviation is within the allowable range, the alignment of the optical axis is completed.

After the alignment of the optical axis is completed, as shown in FIG. 7(b), the XY drive part 33 controls the X-axis direction and the Y-axis direction to move the wafer chuck 32 so that the failure position of the semiconductor device D is captured in the field of view of the observation optical system 13 (S23). At this time, the control part 41b may control the XY drive part 33 based on the movement amount stored when the semiconductor device D is retracted. Further, the relative positions of the laser marking optical system 22 and the semiconductor device D may be controlled using the image data output from the two-dimensional camera 15 and the probing camera 24. Also in this case, a target to be moved is only the semiconductor device D. The movement of the semiconductor device D in this step is also referred to as "return of the semiconductor device D". That is, since the semiconductor device D is retracted immediately after the alignment of the optical axis is completed, the semiconductor device D is not present in the field of view of the observation optical system 13 and the laser marking optical system 22. Therefore, after the alignment of the optical axis is completed, the semiconductor device D is placed in the field of view of the observation optical system 13 and the laser marking optical system 22. More specifically, the failure place in the semiconductor device D coincides with the optical axis of the observation optical system 13 and the optical axis of the laser marking optical system 22. That is, it is the semiconductor device D that is moved after the alignment is completed. In other words, the observation optical system 13 and the laser marking optical system 22 are not moved after the alignment is completed. As a result, the relative positional relationship between the observation optical system 13 and the laser marking optical system 22 is maintained as a result of the alignment.

<Marking Step S30>

Figure 8:
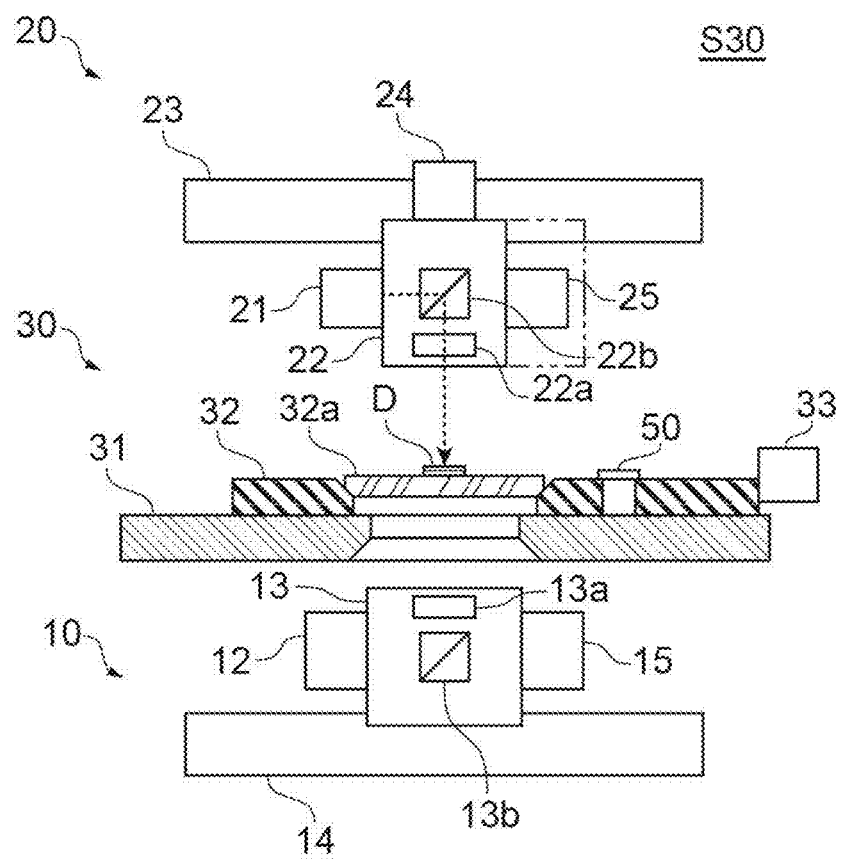
FIG. 8 is a diagram showing one step constituting the alignment step following FIG. 7(b).

As shown in FIG. 8, the laser marking is performed on the marking place mp (S30). The control part 41b outputs a marking command for step S30 to the marking part 20 and the device arrangement part 30. Specifically, the laser light source 21 outputs laser light. The laser marking is performed for all of the set marking places mp. In an output operation of the laser light to each of the marking places mp, the image processing part 41c may determine whether or not the mark image appears on the pattern image. When it is determined that the mark image does not appear on the pattern image, the irradiation of the laser light is performed again. In parallel with the irradiation operation of the laser light, the image processing part 41c generates a pattern image.

Hereinafter, an operation and effect of the analysis device 1 of the present embodiment will be described.

In the analysis device 1 and the semiconductor fault analysis method, first, the optical axis of the laser marking optical system 22 included in the marking part 20 is aligned with the optical axis of the observation optical system 13 included in the analysis part 10 based on the alignment target 50 provided on the wafer chuck 32. Then, the laser light is radiated to the marking position set in the semiconductor device D in a state in which the positional relationship between the optical axis of the observation optical system 13 and the optical axis of the laser marking optical system 22 is maintained. That is, after the optical axis of the observation optical system 13 and the optical axis of the laser marking optical system 22 are aligned with each other, one of the observation optical system 13 and the laser marking optical system 22 does not move relative to the other. Therefore, there is no deviation between a position indicated by a movement command value that may occur due to the movement and an actual position. As a result, it is possible to reduce a deviation of a position indicated by the mark put by the marking part 20 with respect to the position of the failure place indicated by the analysis part 10.

Before the alignment command is output, the control part 41b outputs an analysis command for analyzing the failure place in the semiconductor device D by the analysis part 10 to the analysis part 10. With such a configuration, it is possible to put a mark indicating the position of the failure place with high accuracy.

In the marking command, the semiconductor device D may be irradiated with the laser light after the wafer chuck 32 is moved to the marking position by the XY drive part 33. With such a configuration, after the optical axis of the laser marking optical system 22 is aligned with the optical axis of the observation optical system 13, it is possible to irradiate a desired position on the semiconductor device D with the laser light in a state in which an absolute position in addition to the relative position of the observation optical system 13 and the laser marking optical system 22 is maintained. As a result, it is possible to further reduce the deviation of the position indicated by the mark put by the marking part 20.

The alignment command causes the two-dimensional camera 15 to acquire a first image of the alignment target 50 from one side, causes the probing camera 24 to acquire a second image of the alignment target 50 from the other side, and moves the second drive part to align the optical axis of the laser marking optical system 22 with the optical axis of the observation optical system 13 based on the first image and the second image. With such a configuration, the operation in which the optical axis of the laser marking optical system 22 is aligned with the optical axis of the observation optical system 13 can be reliably performed.

The alignment target 50 is provided at a position different from the device holding part 32a in which the semiconductor device D is held on the wafer chuck 32. With such a configuration, the optical axis of the laser marking optical system 22 can be aligned with the optical axis of the observation optical system 13 regardless of a type of the semiconductor device D.

The two-dimensional camera 15 acquires the first image of the alignment target 50 seen from one side. The probing camera 24 acquires the second image of the target seen from the other side. Also with such a configuration, the operation in which the optical axis of the laser marking optical system 22 is aligned with the optical axis of the observation optical system 13 can be reliably performed.

The alignment target 50 includes the light transmission part 50a that transmits light that can be detected by the two-dimensional camera 15 and the probing camera 24. Also, with such a configuration, the operation in which the optical axis of the laser marking optical system 22 is aligned with the optical axis of the observation optical system 13 can be reliably performed.

For example, a first semiconductor fault analysis device includes an analysis part in which a first optical detection part receives first light from a semiconductor device via a first optical system, and the first optical system is moved relative to the semiconductor device by a first drive part, a marking part in which a second optical detection part receive second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part, wherein the target is detectable by the first optical detection part from one side of the target and is detectable by the second optical detection part from the other side of the target, and the control part outputs an alignment command that moves the chuck to a position at which the target is detectable by the first optical detection part and then aligns the optical axis of the second optical system with the optical axis of the first optical system with the target as a reference to the marking part and the device arrangement part, and outputs a marking command that irradiates a marking position set on the semiconductor device with the laser light in a state in which a positional relationship between the optical axis of the first optical system and the optical axis of the second optical system is maintained to the marking part and the device arrangement part.

In a second semiconductor fault analysis device, the control part of the first semiconductor fault analysis device outputs an analysis command that analyzes a failure place in the semiconductor device with the analysis part to the analysis part before the alignment command is output.

In a third semiconductor fault analysis device, the marking command in the first or second semiconductor fault analysis device causes the chuck to be moved to the marking position by the third drive part and then causes the semiconductor device to be irradiated with the laser light.

The alignment command in any one of the first to third semiconductor fault analysis devices causes the first optical detection part to acquire a first image of the target from one side, causes the second optical detection part to acquire a second image of the target from the other side, and moves the second optical system so that the optical axis of the second optical system is aligned with the optical axis of the first optical system based on the first image and the second image.

In a fourth semiconductor fault analysis device, the target in any one of the first to third semiconductor fault analysis devices is provided at a position different from a device holding part in which the semiconductor device is held in the chuck.

In a fifth semiconductor fault analysis device, the first optical detection part in any one of the first to fourth semiconductor fault analysis devices acquires a first image of the target seen from one side, and the second optical detection part therein acquires a second image of the target seen from the other side.

In a sixth semiconductor fault analysis device, the target in any one of the first to fifth semiconductor fault analysis devices includes a light transmission part which transmits light that is detectable by the first optical detection part and the second optical detection part.

There is provided a semiconductor fault analysis method which analyzes a semiconductor device using a semiconductor fault analysis device, wherein the semiconductor fault analysis device includes an analysis part in which a first optical detection part receives first light from a semiconductor device via a first optical system, and the first optical system is moved relative to the semiconductor device by a first drive part, a marking part in which a second optical detection part receive second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part, wherein the target is detectable by the first optical detection part from one side of the target and is detectable by the second optical detection part from the other side of the target, and the method including an alignment step of moving the chuck to a position at which the target is detectable by the first optical detection part and then aligning the optical axis of the second optical system with the optical axis of the first optical system with the target as a reference, and a marking step of irradiating a marking position set on the semiconductor device with the laser light in a state in which a positional relationship between the optical axis of the first optical system and the optical axis of the second optical system is maintained.

In a second semiconductor fault analysis method, the first semiconductor fault analysis method further includes an analysis step of analyzing a failure place in the semiconductor device with the analysis part before the alignment step.

In a third semiconductor fault analysis method, the marking step in the first or second semiconductor fault analysis method causes the chuck to be moved to the marking position by the third drive part and then causes the semiconductor device to be irradiated with the laser light.

In a fourth semiconductor fault analysis method, the alignment step in the first to third semiconductor fault analysis method causes the first optical detection part to acquire a first image of the target from one side, causes the second optical detection part to acquire a second image of the target from the other side, and moves the second optical system so that the optical axis of the second optical system is aligned with the optical axis of the first optical system based on the first image and the second image.

Although the embodiment of the present invention has been described above, the present invention is not limited to the above embodiment.

For example, it has been described that the laser marking is performed to the extent that the laser light penetrates the metal layer ME and the surface of the substrate SiE in contact with the metal layer ME is exposed. However, the present invention is not limited to the aspect. A depth of the hole by the laser marking may be such that the mark image appears in the pattern image. Specifically, for example, the laser marking may be further performed even after the metal layer ME is penetrated and the surface of the substrate SiE in contact with the metal layer ME is exposed. For example, when a thickness of the metal layer ME is 10 μm and a thickness of the substrate SiE is 500 μm, a hole by the laser marking may be formed by about 1 μm deeper from the surface of the substrate SiE in contact with the metal layer ME. Further, the laser marking does not necessarily have to be performed so as to penetrate the metal layer ME. For example, when the thickness of the metal layer ME is 10 μm and the thickness of the substrate SiE is 500 μm, the thickness of the metal layer ME at a portion in which the hole is formed by the laser marking may be about 50 nm. That is, the hole does not have to reach the surface of the substrate SiE in contact with the metal layer ME.

It has been described that the generation of the pattern image is performed while the laser marking is being performed. However, the present invention is not limited to this aspect. For example, the pattern image may be generated when the output of the laser light is stopped. In this case, the output of the laser light and the stop of the laser light, that is, the generation of the pattern image may be alternately performed at a predetermined interval.

When a wavelength of the laser light output from the laser light source 21 is 1000 nanometers or more, the observation optical system 13 may have an optical filter that blocks only the laser light having a wavelength of 1000 nanometers or more. Therefore, even when the laser light output from the laser light source 21 is transmitted through the substrate SiE of the semiconductor device D, the laser light is blocked by the observation optical system 13. As a result, it is possible to suppress destruction of the optical detector due to the laser light.

The wavelength of the laser light output from the laser light source 21 may be less than 1000 nanometers. In this case, for example, when the semiconductor device D is configured of a substrate such as a silicon substrate, the laser light is absorbed by the substrate. As a result, it is possible to suppress destruction of the optical detector such as the two-dimensional camera 15 due to the laser light without providing an optical filter or the like.

The component that applies the stimulus signal to the semiconductor device D is not limited to the tester unit 11. As a stimulus signal application part which is the component for applying a stimulus signal to the semiconductor device D, a device that applies a voltage or a current to the semiconductor device D may be adopted. Then, the stimulus signal may be applied to the semiconductor device D using such a device.

Semiconductor Fault Analysis Device of Second Embodiment

Figure 9:
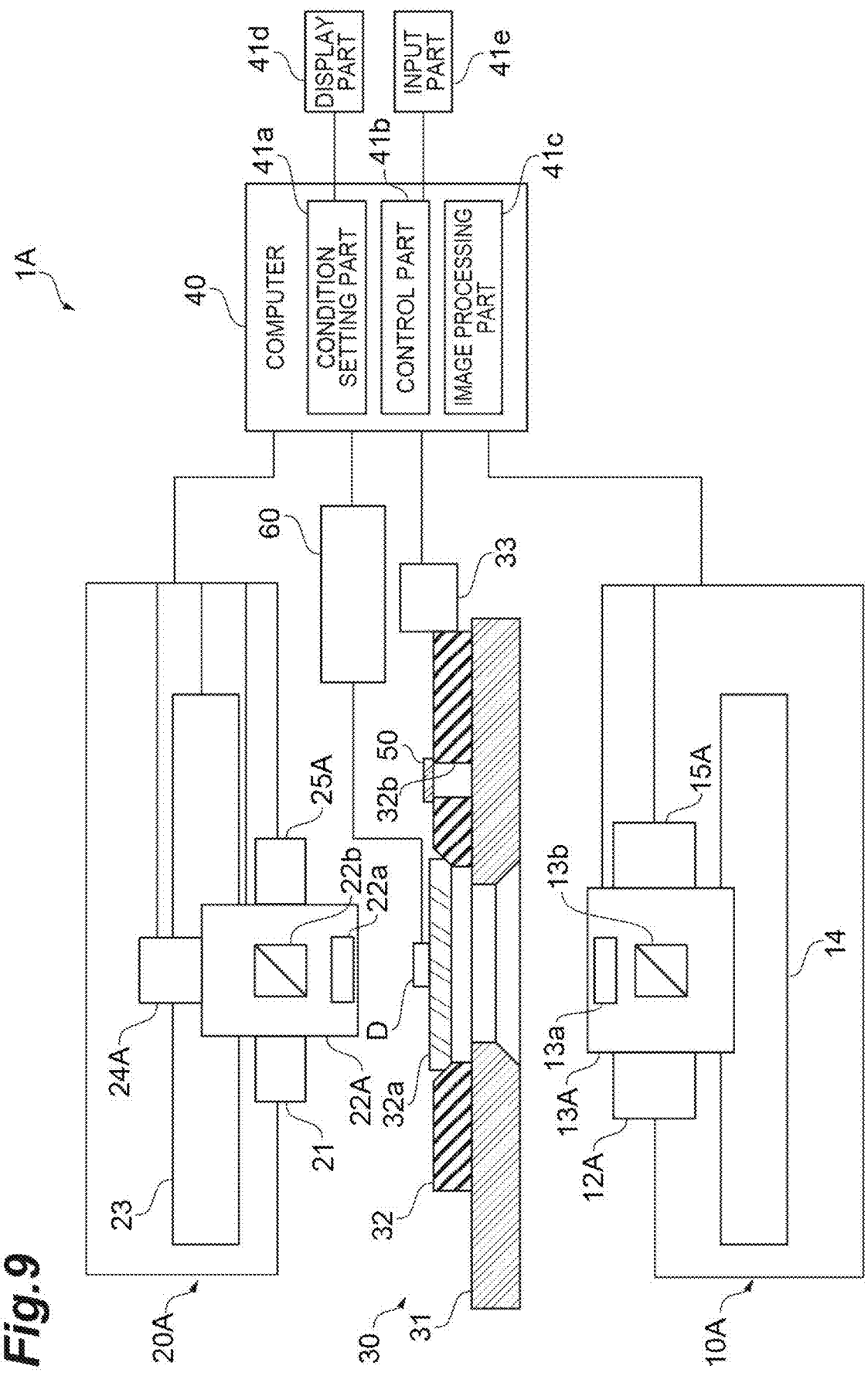
FIG. 9 is a configuration diagram of a semiconductor fault analysis device of a second embodiment.

As shown in FIG. 9, a semiconductor fault analysis device of a second embodiment (hereinafter referred to as "analysis device 1A") includes a first analysis part 10A, a second analysis part 20A, a device arrangement part 30, a computer 40, and a stimulus signal application part 60.

The first analysis part 10A includes a first light source 12A, a first observation optical system 13A (a first optical system), an XYZ stage 14 (a first drive part), and a first camera 15A (first optical detection part). The first light source 12A has the same configuration as the light source 12 of the first embodiment. The first observation optical system 13A has the same configuration as the observation optical system 13 of the first embodiment. The first camera 15A has the same configuration as the two-dimensional camera 15 of the first embodiment.

The second analysis part 20A includes laser light source 21, a second observation optical system 22A (a second optical system), an XYZ stage 23 (a second drive part), a second camera 24A (a second optical detection part), and a second light source 25A. The second observation optical system 22A has the same configuration as the laser marking optical system 22 of the first embodiment. The second camera 24A has the same configuration as the probing camera 24 of the first embodiment. The second light source 25A has the same configuration as the illumination light source 25 of the first embodiment.

Any one of the first analysis part 10A and the second analysis part 20A may have a function of putting a mark indicating a failure place. That is, any one of the first analysis part 10A and the second analysis part 20A may have a marking laser light source included in the marking part 20 of the first embodiment. The laser light source 21 of the second analysis part 20A may be used as the marking laser light source.

Semiconductor Fault Analysis Method of Second Embodiment

Figure 10:
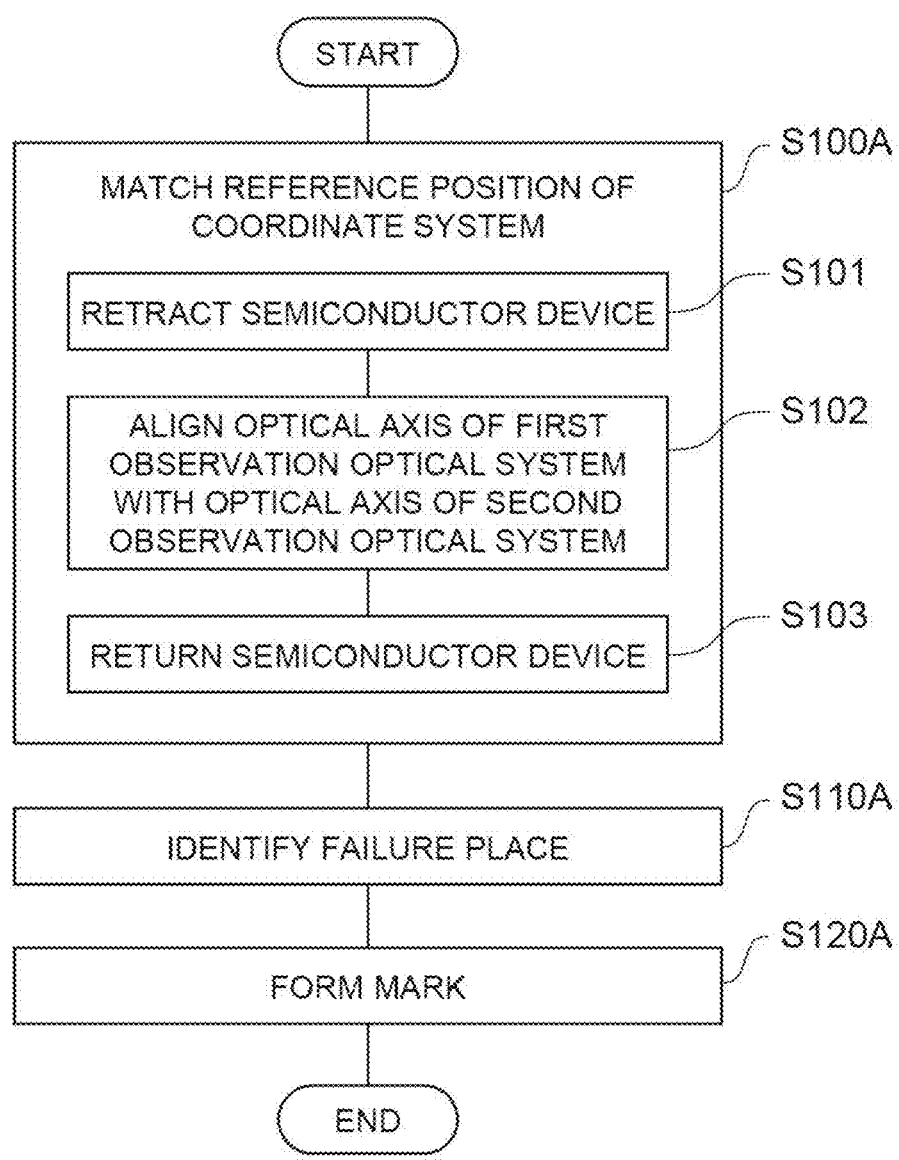
FIG. 10 is a flow chart showing a main process in a semiconductor fault analysis method using the analysis device of FIG. 9.

Next, an analysis process of the analysis device 1A will be described. FIG. 10 is a flowchart showing a main process in analysis processing using the analysis device 1A.

<Alignment Step S100A>

First, the alignment between the first observation optical system 13A and the second observation optical system 22A is performed (S100A). The control part 41b outputs an alignment command for step S100A to the second analysis part 20A and the device arrangement part 30. The XY drive part 33 moves the wafer chuck 32 so that the alignment target 50 is captured in the field of view of the first observation optical system 13A (S101). The control part 41b stores a movement amount of the semiconductor device D (the wafer chuck 32).

Next, the optical axis of the first observation optical system 13A and the optical axis of the second observation optical system 22A are aligned with each other (S102). First, the XYZ stage 23 moves the second observation optical system 22A so that the alignment target 50 is captured in the field of view of the second observation optical system 22A. Next, the second light source 25A outputs the illumination light toward the alignment target 50. The illumination light is transmitted through the light transmission part 50a of the alignment target 50. The first camera 15A of the first observation optical system 13A obtains a transmission image due to the light transmitted through the light transmission part 50a of the alignment target 50. The first camera 15A outputs the transmission image to the computer 40. The second camera 24A obtains a reflection image due to the reflected light reflected by the opaque part 50b of the alignment target 50. Then, the second camera 24A outputs the reflection image to the computer 40. The image processing part 41c calculates a deviation of the optical axis of the second observation optical system 22A with respect to the optical axis of the first observation optical system 13A using the transmission image and the reflection image. The movement of the second observation optical system 22A and the confirmation of the deviation amount are repeated until the deviation is within an allowable range. When it is determined that the deviation is within the allowable range, the alignment of the optical axis is completed. As an operation for keeping the deviation within the allowable range, the second observation optical system 22A may be moved in a state in which a position of the first observation optical system 13A is fixed. Further, the first observation optical system 13A may be moved in a state in which a position of the second observation optical system 22A is fixed. Further, both the first observation optical system 13A and the second observation optical system 22A may be moved.

After the alignment of the optical axis is completed, the XY drive part 33 moves the wafer chuck 32 so that the semiconductor device D is captured in the field of view of the first observation optical system 13A and the second observation optical system 22A (S103). At this time, the control part 41b may control the XY drive part 33 based on a movement amount stored when the semiconductor device D is retracted. Further, the relative positions between the first observation optical system 13A and the second observation optical system 22A and the semiconductor device D may be controlled using the image data output from the first camera 15A and the second camera 24A. Also in this case, a target to be moved is only the semiconductor device D. Immediately after the alignment of the optical axis is completed, the semiconductor device D is retracted, and thus the semiconductor device D is not present in the field of view of the first observation optical system 13A and the second observation optical system 22A. Therefore, after the alignment of the optical axis is completed, the semiconductor device D is placed in the field of view of the first observation optical system 13A and the second observation optical system 22A. More specifically, the semiconductor device D is disposed on the optical axis of the first observation optical system 13A and the optical axis of the second observation optical system 22A. That is, only the semiconductor device D is moved after the alignment is completed. In other words, after the alignment is completed, the first observation optical system 13A and the second observation optical system 22A are not moved. As a result, the relative positional relationship between the first observation optical system 13A and the second observation optical system 22A is maintained as a result of the alignment.

<Analysis Step S110A>

Next, the failure place in the semiconductor device D is identified (S110A). In the analysis step S110A, so-called luminescence analysis is performed. When the luminescence analysis is performed, the first camera 15A and the second camera 24A employ an image pickup device capable of detecting light having a wavelength transmitted through the substrate SiE of the semiconductor device D. For example, a camera equipped with a charge coupled device (CCD) image sensor or a complementary metal oxide semiconductor (CMOS) image sensor may be adopted. Further, an InGaAs camera, an MCT camera, or the like may be adopted.

First, the computer 40 stops the radiation of the illumination light from the first light source 12A and the second light source 25A. Next, the computer 40 outputs a stimulus signal from the stimulus signal application part 60 to the semiconductor device D. When a metal layer ME of the semiconductor device D includes a failure place, emission light is emitted at the failure place. The light emitted by the metal layer ME is incident on the first observation optical system 13A through one surface of the substrate SiE. As a result, the first camera 15A outputs an image corresponding to the incident light to the computer 40. Similarly, the light emitted by the metal layer ME is incident on the second observation optical system 22A through the other surface of the substrate SiE. As a result, the second camera 24A outputs an image corresponding to the incident light to the computer 40. The computer 40 identifies the failure place by identifying a light emission position from the image data.

An image pickup operation of the first camera 15A and the second camera 24A may take a first aspect and a second aspect. The image pickup operation is an operation capable of outputting image data when light input is received. Therefore, "to perform an image pickup operation" means making the camera reachable to light and making the camera that has received light output image data.

As the first aspect, the image pickup operation of the first camera 15A and the image pickup operation of the second camera 24A may be performed in parallel in time. That is, the image pickup operation of the second camera 24A may be performed while the image pickup operation of the first camera 15A is being performed. More specifically, the computer 40 makes the first camera 15A reachable to light in the first observation optical system 13A and makes the first camera 15A that receives the light output the image data. Further, the computer 40 makes the second camera 24A reachable to light in the second observation optical system 22A and makes the second camera 24A that has received the light output the image data.

In the first aspect, when light is output from both one surface and the other surface of the semiconductor device D, image data is output from both the first camera 15A and the second camera 24A. However, when the emission light is generated, the emission light is not always output from both one surface and the other surface of the semiconductor device D. For example, the emission light may be blocked in a wiring layer. That is, light may be output from one surface of the semiconductor device D, but light may not be output from the other surface. In the first aspect, both the first camera 15A and the second camera 24A are in a state in which the image data can be output. However, since the light is incident only on the first camera 15A, only the first camera 15A outputs the image data. On the contrary, light may be output from the other surface of the semiconductor device D, but light may not be output from one surface. In this case, only the second camera 24A outputs the image data.

Further, as the second aspect, the image pickup operation of the first camera 15A and the image pickup operation of the second camera 24A may be performed alternately. That is, in a first period, the image pickup operation of the first camera 15A is performed. In a second period which does not overlap the first period, the image pickup operation of the second camera 24A is performed.

More specifically, in the first period, the computer 40 makes the first camera 15A reachable to light in the first observation optical system 13A and makes the first camera 15A that has received the light output image data. Further, the computer 40 makes the light not reach the second camera 24A in the second observation optical system 22A, and/or makes the second camera 24A that has received the light not output the image data. In the second period, the computer 40 makes the light not reach the first camera 15A in the first observation optical system 13A, and/or makes the first camera 15A that has received the light not output the image data. Further, the computer 40 makes the second camera 24A reachable to light in the second observation optical system 22A, and makes the second camera 24A that has received the light output the image data.

<Marking Step S120A>

Laser marking is performed on the marking place mp (S120A). The control part 41b outputs a marking command for step S120A to the second analysis part 20A and the device arrangement part 30. Specifically, the laser light source 21 outputs laser light. The laser marking is performed for all of the set marking places mp. In an output operation of the laser light to each of the marking places mp, the image processing part 41c may determine whether or not a mark image appears on a pattern image. When it is determined that a mark image does not appear on the pattern image, the radiation of the laser light is performed again. In parallel with the radiation operation of the laser light, the image processing part 41c generates the pattern image.

The analysis device 1A includes the first analysis part 10A in which the light emitted by the semiconductor device D is received by the first camera 15A via the first observation optical system 13A, and the first observation optical system 13A is moved relative to the semiconductor device D by the first drive part, the second analysis part 20A in which the light emitted by the semiconductor device D is received by the second camera 24A via the second observation optical system 22A, and the second observation optical system 22A is moved relative to the semiconductor device D by the second drive part, a device arrangement part 30 having the wafer chuck 32 disposed between the first analysis part 10A and the second analysis part 20A to hold the semiconductor device D and provided with the alignment target 50 for aligning the optical axis of the first observation optical system 13A with the optical axis of the second observation optical system 22A and in which the wafer chuck 32 is moved relative to the first analysis part 10A and the second analysis part 20A, the stimulus signal application part 60 that applies a stimulus signal to the semiconductor device D, and the control part 41b that outputs a command to the first analysis part 10A, the second analysis part 20A, the device arrangement part 30, and the stimulus signal application part 60. The alignment target 50 can be detected by the first analysis part 10A from one side of the alignment target 50 and can be detected by the second analysis part 20A from the other side of the alignment target 50. The control part 41b outputs an alignment command that moves the wafer chuck 32 to a position at which the first camera 15A can detect the alignment target 50 and then aligns the optical axis of the second observation optical system 22A with the optical axis of the first observation optical system 13A with the alignment target 50 as a reference to the second analysis part 20A and the device arrangement part 30. Further, the control part 41b outputs an analysis command that applies a stimulus signal to the semiconductor device D and receives the light from the semiconductor device D emitted according to the stimulus signal at at least one of the first camera 15A and the second camera 24A in a state in which a positional relationship between the optical axis of the first observation optical system 13A and the optical axis of the second observation optical system 22A is maintained to the first analysis part 10A, the second analysis part 20A, the stimulus signal application part 60, and the device arrangement part 30.

A semiconductor fault analysis method that analyzes the semiconductor device D using the analysis device 1A includes an alignment step (S100A) of moving the wafer chuck 32 to the position at which the first camera 15A can detect the alignment target 50 and then aligning the optical axis of the second observation optical system 22A with the optical axis of the first observation optical system 13A with the alignment target 50 as a reference and an analysis step (S120A) of applying a stimulus signal to the semiconductor device D and receiving light from the semiconductor device D emitted according to the stimulus signal at at least one of the first camera 15A and the second camera 24A in a state in which the positional relationship between the optical axis of the first observation optical system 13A and the optical axis of the second observation optical system 22A is maintained.

In the analysis device 1A and the semiconductor fault analysis method, the stimulus signal is applied to the semiconductor device D and the light from the semiconductor device D emitted according to the stimulus signal is received at at least one of the first camera 15A and the second camera 24A in a state in which the positional relationship between the optical axis of the first observation optical system 13A and the optical axis of the second observation optical system 22A is maintained. Since the first observation optical system 13A and the second observation optical system 22A that receive the light from the semiconductor device D are in the state in which the optical axes are aligned with each other, the failure place in the semiconductor device D can be satisfactorily detected.

Modified Examples

In the analysis step, an analysis different from the above-described light emission analysis may be performed. For example, in the analysis step, a heat generation analysis may be performed. In this case, the stimulus signal application part 60 applies a modulation current having a relatively low frequency as the stimulus signal. For example, when a short-circuited place is included inside the semiconductor device D, the short-circuited place generates heat due to the modulation current. As a result, a heat source is generated in the semiconductor device D. A temperature of the heat source that generates heat due to the modulation current changes periodically according to the frequency of the modulation current. A change in the temperature affects a refractive index of a member around the heat source through which the irradiation light and the reflected light pass. The change in the refractive index causes a change in intensity of the reflected light, and as a result, a reflectance which is a degree of the intensity of the reflected light with respect to the intensity of the irradiation light changes. The change in the reflectance due to the temperature change of the heat source is used as a response to the stimulus signal. As a result, it is possible to identify the short-circuited place which is an example of a failure place included in the semiconductor device D.

Semiconductor Fault Analysis Device of Modified Example

Figure 11:
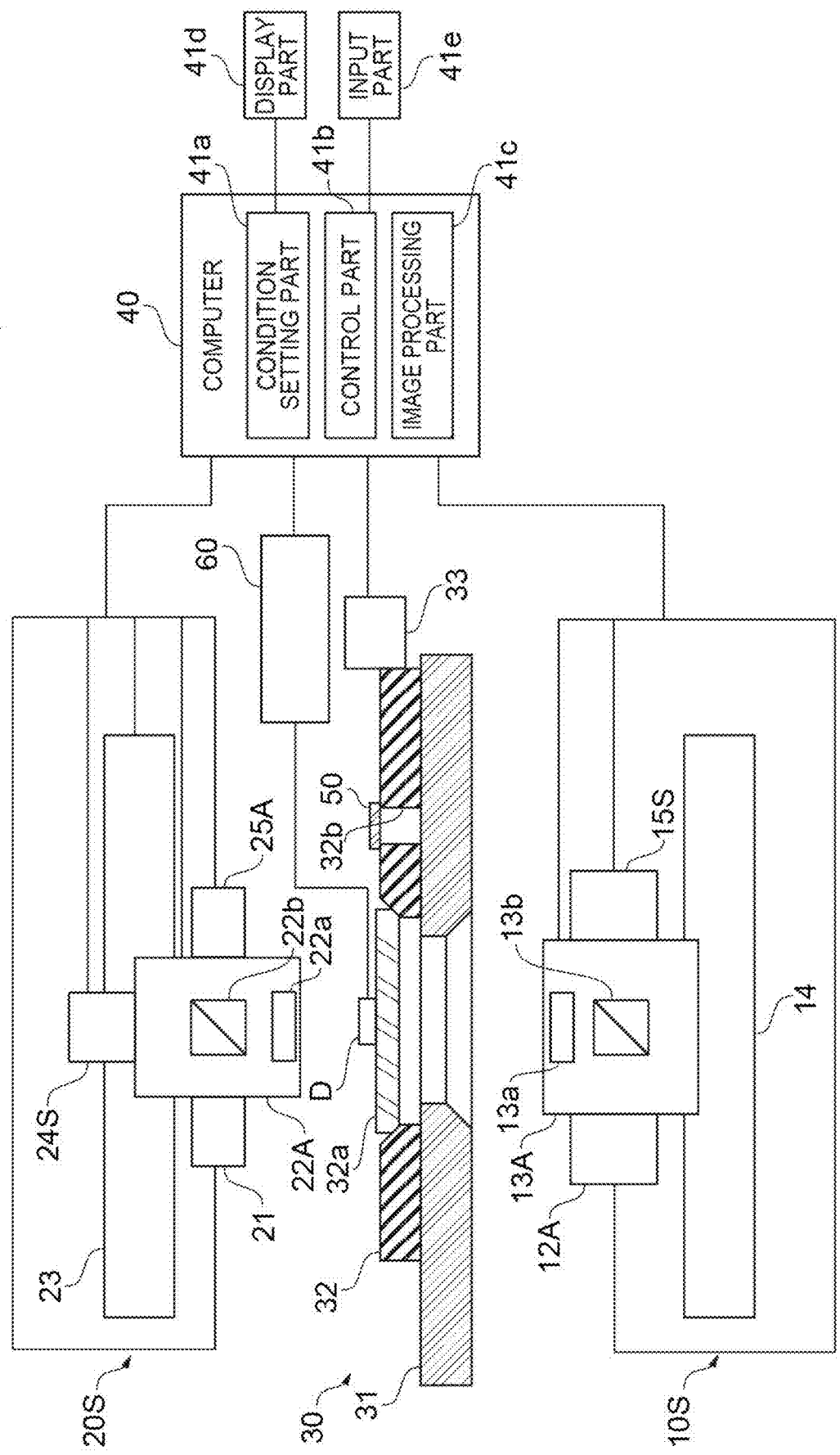
FIG. 11 is a configuration diagram of a semiconductor fault analysis device of a modified example.

As shown in FIG. 11, a semiconductor fault analysis device of a modified example (hereinafter referred to as "analysis device 1S") includes a first analysis part 10S, a second analysis part 20S, a device arrangement part 30, a computer 40, and a stimulus signal application part 60. The first analysis part 10S has a first infrared camera 15S instead of the first camera 15A. Further, the second analysis part 20S has a second infrared camera 24S instead of the second camera 24A.

The first infrared camera 15S is an optical detection part in which a detection target is a wavelength different from visible light. The first infrared camera 15S targets, for example, light having a wavelength of 2 μm to 10 μm, which is a heat ray, as a detection target. As the first infrared camera 15S, an InSb camera or the like may be used. According to the first infrared camera 15S, it is possible to acquire an image showing a distribution of an emissivity of the semiconductor device D. The first infrared camera 15S outputs image data by capturing the heat ray from the semiconductor device D. A heat generation place in the semiconductor device D can be identified using infrared information corresponding to the image data. The failure place in the semiconductor device D can be identified by identifying the heat generation place. The second infrared camera 24S has the same configuration as the first infrared camera 15S.

The image processing part 41c of the computer 40 generates an infrared image based on the above-described image data. Further, the image processing part 41c generates a pattern image based on the detection signal. Then, the image processing part 41c generates an overlapping image in which the infrared image overlaps the pattern image as an analysis image.

When the heat ray is the detection target, unlike the case in which a visible light image is obtained, the illumination light is not required. Therefore, the analysis device 1S can omit the first light source 12A and the second light source 25A. When the first light source 12A is omitted, the beam splitter 13b can be omitted from the first observation optical system 13A. Similarly, when the second light source 25A is omitted, the second observation optical system 22A can omit the switching part 22b which is the beam splitter.

Semiconductor Fault Analysis Method of Modified Example

Figure 12:
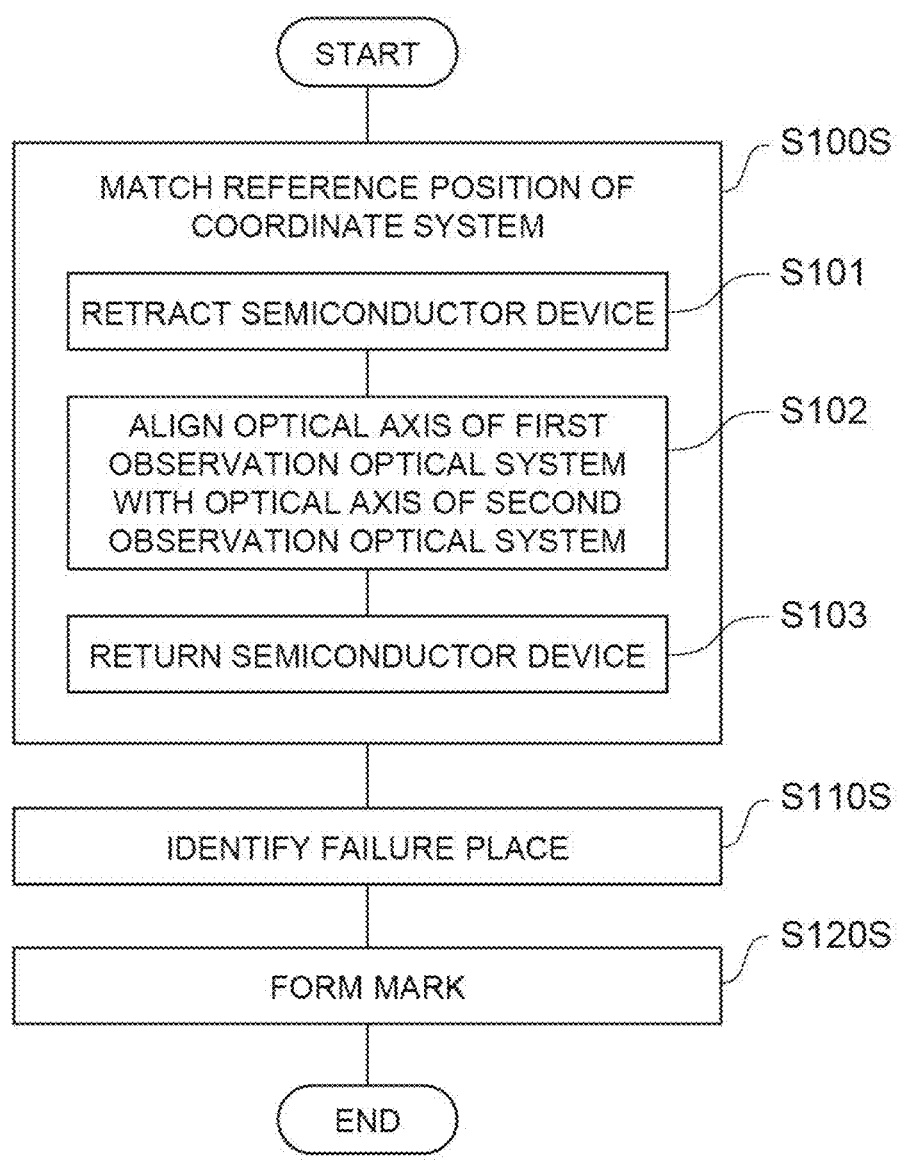
FIG. 12 is a flow chart showing a main process in a semiconductor fault analysis method using the analysis device of FIG. 11.

Next, an analysis process of the analysis device 1S will be described. FIG. 12 is a flow chart showing a main process in the analysis process using the analysis device 1S.

<Alignment Process S100S>

An alignment step S100S of the modified example is the same as the alignment step S100A of the second embodiment.

<Analysis Step S110S>

Next, the failure place in the semiconductor device D is identified (S110S). First, the heat ray from the semiconductor device D is measured by the first infrared camera 15S, and an infrared image is generated in the image processing part 41c. A state in which a stimulus signal such as a test pattern is applied by the stimulus signal application part 60 is achieved. The first infrared camera 15S acquires first image data including the heat generated by the semiconductor device D. The first infrared camera 15S sends a plurality of sheets of image data continuously captured in a predetermined exposure time to the computer 40 as the first image data. The image processing part 41c adds the plurality of sheets of image data. The first image data is generated by the addition process. The first image data includes information on heat generation of the semiconductor device D and a shape of an element forming the semiconductor device D. Next, the application of the stimulus signal by the stimulus signal application part 60 is stopped. The first infrared camera 15S acquires image data including only information on the shape of the element forming the semiconductor device D. The first infrared camera 15S outputs the plurality of sheets of image data continuously captured in a predetermined exposure time to the computer 40. The image processing part 41c adds the plurality of sheets of image data. Second image data is generated by the addition process. The second image data includes only information on the shape of the element forming the semiconductor device D. Then, the image processing part 41c obtains a difference between the first image data and the second image data. As a result, an infrared image including only the heat generation of the semiconductor device D is generated. The image processing part 41c outputs an overlapping image in which an infrared image overlaps the second image data or the first image data as the analysis image. Further, the image processing part 41c outputs the second image data as the pattern image.

Further, the second analysis part 20S also performs the same processing as the heat generation analysis operation in the first analysis part 10S described above. The heat generation analysis operation in the first analysis part 10S and the heat generation analysis operation in the second analysis part 20S may be performed in parallel. Moreover, the operations may be performed alternately.

<Marking Step S120S>

A marking process 120S of the modified example is the same as the marking process S120A of the second embodiment.

The analysis device 1S and the semiconductor fault analysis method of the modified example also perform a process of detecting a failure place in a state in which the optical axis of the first observation optical system 13S and the optical axis of the second observation optical system 22S coincide with each other. The failure place in the semiconductor device D can be satisfactorily detected.

Semiconductor Fault Analysis Device of Third Embodiment

Figure 13:
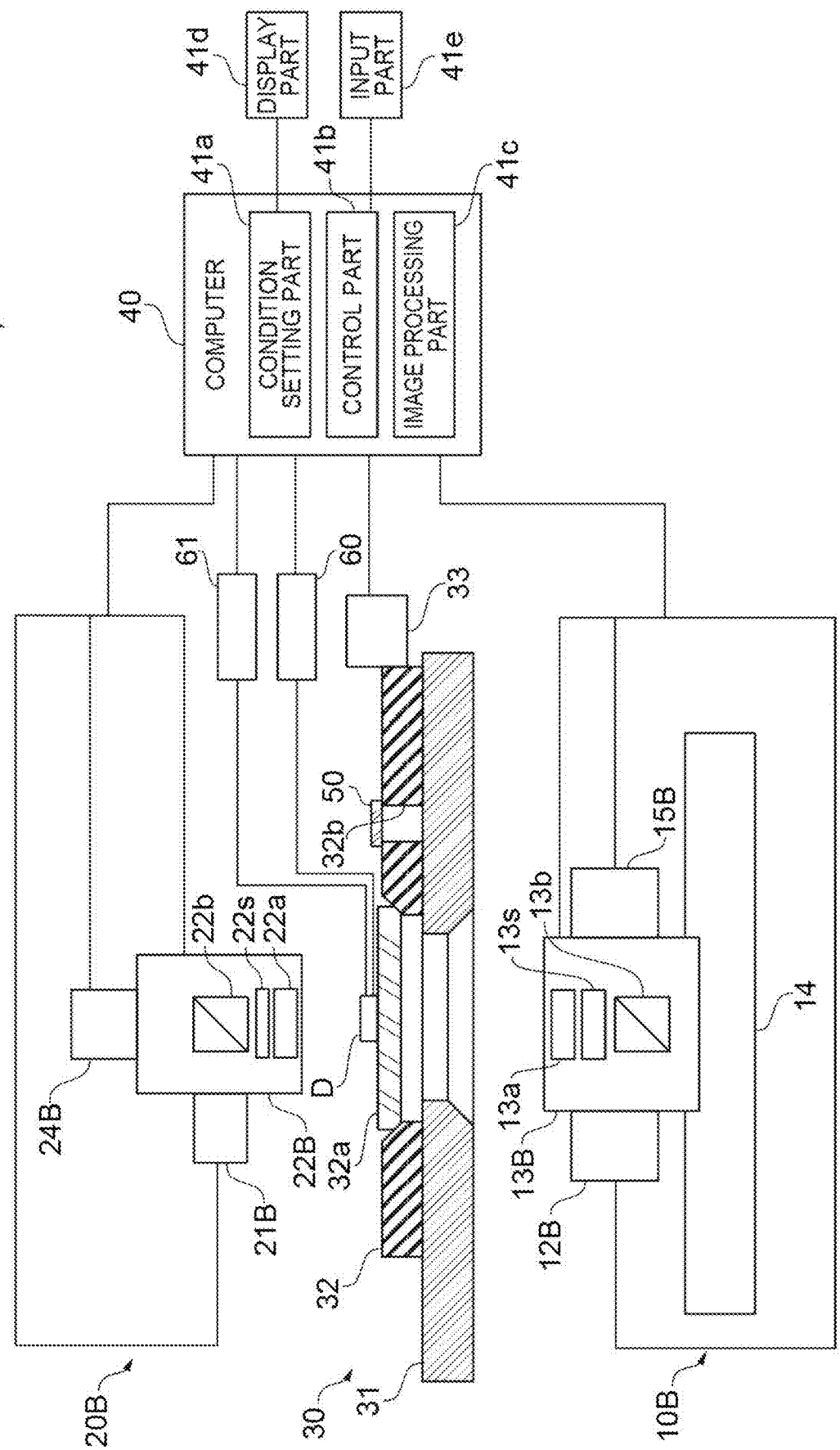
FIG. 13 is a configuration diagram of a semiconductor fault analysis device of a third embodiment.

As shown in FIG. 13, a semiconductor fault analysis device of a third embodiment (hereinafter referred to as "analysis device 1B") includes a first analysis part 10B, a second analysis part 20B, a device arrangement part 30, a computer 40, a stimulus signal application part 60, and an electrical signal acquisition part 61. The analysis device 1B outputs light from a first analysis part 10B and a second analysis part 20B. The light output by the first analysis part 10B irradiates one surface of the substrate SiE of the semiconductor device D. The light output by the second analysis part 20B irradiates the other surface of the substrate SiE of the semiconductor device D. The analysis device 1B analyzes the failure place in the semiconductor device D using an electrical signal generated by the irradiation of light. The semiconductor device D irradiated with light may or may not receive a stimulus signal.

The first analysis part 10B includes a first light source 12B, a first observation optical system 13B (a first optical system), an XYZ stage 14 (a first drive part), and a first camera 15B (a first optical detection part). The first light source 12B generates light to irradiate the semiconductor device D. The details of the first light source 12B are determined according to an analysis method.

For example, in an analysis of irradiating the semiconductor device D with coherent light such as laser light, a solid-state laser light source, a semiconductor laser light source, or the like may be adopted as the first light source 12B. In an analysis for acquiring an optical beam induced resistance change (OBIRCH) image or an soft defect localization (SDL) image, the first light source 12B outputs laser light having a wavelength band in which the semiconductor device D does not generate a charge (a carrier). For example, in an analysis of the semiconductor device D made of silicon, the first light source 12B outputs laser light having a wavelength band of larger than 1200 nm. The first light source 12B preferably outputs laser light having a wavelength band of about 1300 nm. Further, in an analysis of acquiring an OBIC image or a laser assisted device alteration (LADA) image, the first light source 12B outputs light having a wavelength band in which the semiconductor device D generates a charge (a carrier). In the analysis of acquiring the OBIC image or the LADA image, the first light source 12B outputs light having a wavelength band of 1200 nm or less. For example, the first light source 12B outputs laser light having a wavelength band of about 1064 nm.

In an analysis of irradiating the semiconductor device D with incoherent light, a super luminescent diode (SLD), an amplified spontaneous emission (ASE), a light emitting diode (LED) and the like may be adopted as the first light source 12B.

The light output from the first light source 12B is guided to the first observation optical system 13B via a polarization storage single mode optical coupler (not shown) and a polarization storage single mode optical fiber for probe light. The first observation optical system 13B includes an objective lens 13a, a beam splitter 13b, and a first optical scanning part 13s. The first optical scanning part 13s scans an irradiation spot on the back surface of the semiconductor device D. The first optical scanning part 13s is configured of an optical scanning element such as a galvano mirror or a MEMS mirror. The objective lens 13a collects the light guided by the first optical scanning part 13s on the irradiation spot. The first optical scanning part 13s is controlled by the control part 41b of the computer 40.

The first camera 15B detects the reflected light of the semiconductor device D according to the laser light. The first camera 15B outputs a detection signal to the computer 40. The first camera 15B is, for example, a photodiode, an avalanche photodiode, a photomultiplier tube, an area image sensor, or the like.

The second analysis part 20B includes a second light source 21B, a second observation optical system 22B (a second optical system), and a second camera 24B (a second optical detection part). The second light source 21B has the same configuration as the first light source 12B. The second observation optical system 22B includes an objective lens 22a, a switching part 22b (a beam splitter), and a second optical scanning part 22s. The second optical scanning part 22s has the same configuration as the first optical scanning part 13s. The second camera 24B has the same configuration as the probing camera 24 of the first embodiment.

The electrical signal acquisition part 61 is electrically connected to the semiconductor device D. The electrical signal acquisition part 61 detects an electrical signal generated by the semiconductor device D according to the laser light. The electrical signal acquisition part 61 outputs an electrical signal characteristic value corresponding to a detected electrical signal to the computer 40.

The image processing part 41c of the computer 40 outputs an electrical signal image based on the electrical signal characteristic value. The electrical signal image is an image obtained by imaging the electrical signal characteristic value in association with scanning positions of the laser light by the first optical scanning part 13s and the second optical scanning part 22s. Further, the image processing part 41c outputs an optical reflection image based on the detection signal. Then, the image processing part 41c overlaps the electrical signal image on the optical reflection image. As a result, the image processing part 41c outputs an overlapping image in which the electrical signal image overlaps the optical reflection image as the analysis image.

The electrical signal image is, for example, an OBIC image which is a photovoltaic current image, an OBIRCH image which is an electricity quantity change image, an SDL image which is a correct/incorrect information image, a LADA image, and the like.

The OBIC image is based on the photovoltaic current generated by laser irradiation. The OBIC image is an image obtained by imaging a current value or a current change value of the photovoltaic current as the electrical signal characteristic value.

The OBIRCH image is based on a resistance value generated at a position at which the semiconductor device D is irradiated with the laser light. A constant current is applied to the semiconductor device D to which the laser light is radiated. A change in the resistance value can be obtained as a change in a voltage value or in the voltage. The OBIRCH image is an image obtained by imaging the electrical signal characteristic value that indicates a change in a voltage value or in the voltage. When the OBIRCH image is obtained, a constant voltage may be applied to the semiconductor device D to which the laser light is radiated. In this case, the change in the resistance value of the irradiation position in the semiconductor device D can be obtained as the change in the current value. The OBIRCH image is an image obtained by imaging an electrical signal characteristic value that indicates a change in the current value.

The SDL image is an image obtained by imaging information related to a malfunction state (for example, a PASS/FAIL signal). Laser light is radiated to the semiconductor device D to which a stimulus signal such as a test pattern is applied. The laser light has a wavelength at which the carrier is not excited. The malfunction state can be detected by applying the stimulus signal and radiating the laser light. Then, the information related to the malfunction is acquired as a luminance value. The SDL image is an image based on the luminance value.

A LADA image is also an image obtained by imaging the information related to the malfunction state (for example, a PASS/FAIL signal). However, an analysis of obtaining the LADA image is different from the analysis of obtaining the SDL image in that the semiconductor device D is irradiated with laser light having a wavelength that excites the carrier. The fact that the information related to the malfunction is acquired as the luminance value by applying the stimulus signal and radiating the laser light and the fact that the image data is generated based on the luminance value are the same as in the SDL image.

Any one of the first analysis part 10B and the second analysis part 20B may have a function of putting a mark indicating a failure place. That is, any one of the first analysis part 10B and the second analysis part 20B may have a marking laser light source included in the marking part 20 of the first embodiment.

Semiconductor Fault Analysis Method of Third Embodiment

Figure 14:
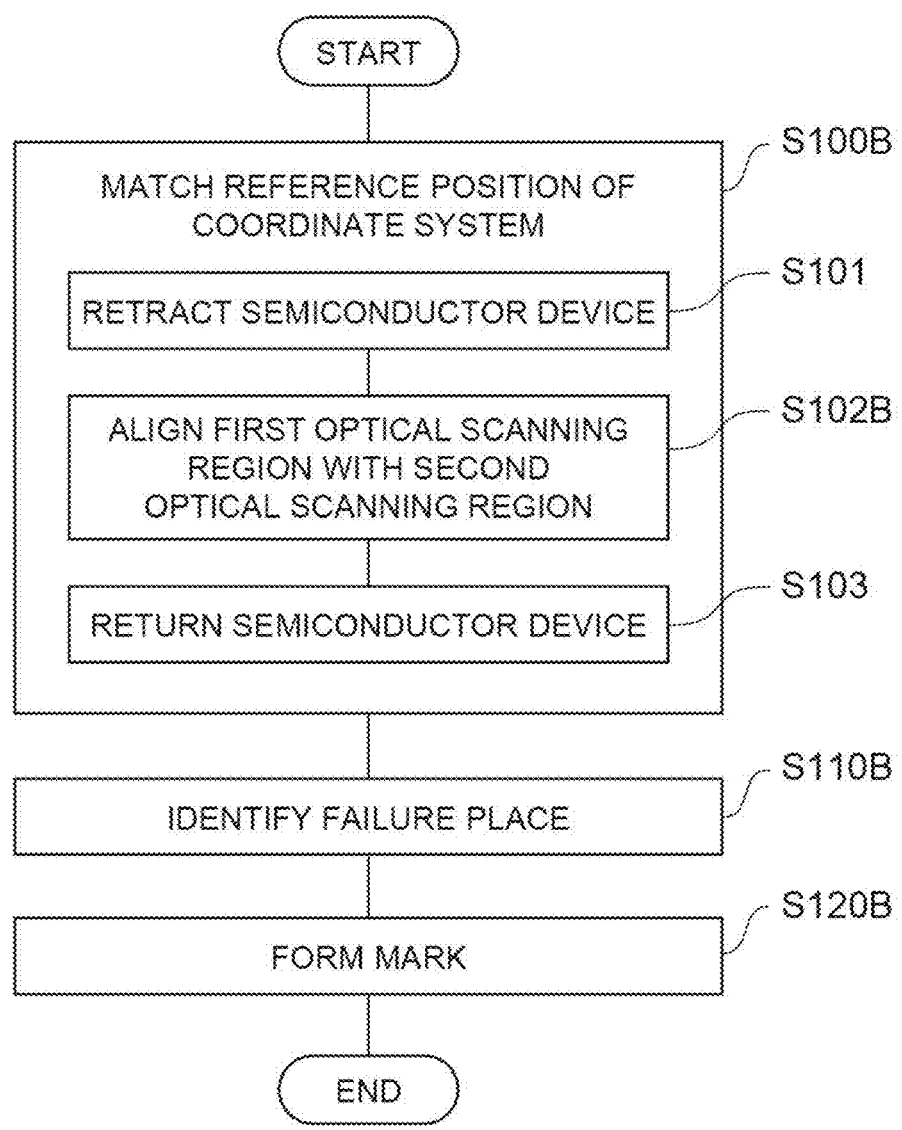
FIG. 14 is a flow chart showing a main process in a semiconductor fault analysis method using the analysis device of FIG. 13.

Next, an analysis process of the analysis device 1B will be described. FIG. 14 is a flow chart showing a main process of the analysis process using the analysis device 1B.

<Alignment Step S100B>

First, an alignment between the first observation optical system 13B and the second observation optical system 22B is performed (S100B). The alignment here means to eliminate a deviation between a center of a first optical scanning region of the first observation optical system 13B and a center of a second optical scanning region of the second observation optical system 22B by aligning the optical axis of the first observation optical system 13B with the optical axis of the second observation optical system 22B. The control part 41b outputs an alignment command for step S100B to the second analysis part 20B and the device arrangement part 30. The XY drive part 33 moves the wafer chuck 32 so that the alignment target 50 is captured in the field of view of the first observation optical system 13B (S101). The control part 41b stores a movement amount of the semiconductor device D. The movement amount may be that of the wafer chuck 32.

Next, the first optical scanning region of the first observation optical system 13B and the second optical scanning region of the second observation optical system 22B are aligned with each other (S102B). This refers to aligning the center of the first optical scanning region of the first observation optical system 13B with the center of the second optical scanning region of the second observation optical system 22B by aligning the optical axis of the first observation optical system 13B with the optical axis of the second observation optical system 22B. First, the XYZ stage 23 moves the second observation optical system 22B so that the alignment target 50 is captured in the field of view of the second observation optical system 22B. Next, the second light source 25B outputs the illumination light toward the alignment target 50. The illumination light is transmitted through the light transmission part 50a of the alignment target 50. The first camera 15B of the first observation optical system 13B obtains a transmission image by the light transmitted through the light transmission part 50a of the alignment target 50. The first camera 15B outputs the transmission image to the computer 40. The second camera 24B obtains a reflection image due to the reflected light reflected by the opaque part 50b of the alignment target 50. Then, the second camera 24B outputs the reflection image to the computer 40. The image processing part 41c calculates a deviation of the optical axis of the second observation optical system 22B with respect to the optical axis of the first observation optical system 13B using the transmission image and the reflection image. The movement of the second observation optical system 22B and the confirmation of the deviation amount are repeated until the deviation is within an allowable range. When it is determined that the deviation is within the allowable range, the alignment of the optical axis is completed. As a result, the center of the first optical scanning region of the first observation optical system 13B and the center of the second optical scanning region of the second observation optical system 22B can be aligned with each other. As an operation for keeping the deviation within the allowable range, the second observation optical system 22B may be moved in a state in which the position of the first observation optical system 13B is fixed. Further, the first observation optical system 13B may be moved in a state in which the position of the second observation optical system 22B is fixed. Further, both the first observation optical system 13B and the second observation optical system 22B may be moved.

After the alignment of the optical scanning region is completed, the XY drive part 33 controls the X-axis direction and the Y-axis direction to move the wafer chuck 32 so that the semiconductor device D is captured in the field of view of the first observation optical system 13B and the second observation optical system 22B (S103). At this time, the control part 41b may control the XY drive part 33 based on the movement amount stored when the semiconductor device D is retracted. Further, relative positions between the first observation optical system 13B and the second observation optical system 22B and the semiconductor device D may also be controlled using the image data output from the first camera 15B and the second camera 24B. Also in this case, a target to be moved is only the semiconductor device D. Immediately after the alignment of the scanning region is completed, since the semiconductor device D is retracted, the semiconductor device D is not present in the field of view of the first observation optical system 13B and the second observation optical system 22B. Therefore, after the alignment of the scanning region is completed, the semiconductor device D is placed in the field of view of the first observation optical system 13B and the second observation optical system 22B. More specifically, the semiconductor device D is disposed in the first optical scanning region of the first observation optical system 13B and the second optical scanning region of the second observation optical system 22B. That is, it is the semiconductor device D that is moved after the alignment is completed. In other words, after the alignment is completed, the first observation optical system 13B and the second observation optical system 22B are not moved. As a result, the relative positional relationship between the first optical scanning region of the first observation optical system 13B and the second optical scanning region of the second observation optical system 22B is maintained as a result of the alignment.

<Analysis Step S110B>

Next, a failure place in the semiconductor device D is identified (S110B). In an analysis step S110B, a signal analysis by light irradiation is performed. The first observation optical system 13B irradiates one surface of the semiconductor device D with first laser light. Further, the second observation optical system 22B irradiates the other surface of the semiconductor device D with second laser light. The irradiation of the first laser light and the second laser light may be parallel in time. That is, a period in which the first laser light is radiated may partially overlap a period in which the second laser light is radiated. Further, the period in which the first laser light is radiated may not overlap the period in which the second laser light is radiated. That is, the irradiation of the second laser light may be started after the irradiation of the first laser light is stopped. In the analysis step S110B, some electrical signal images can be obtained according to characteristics of the first laser light and the second laser light and a state of the semiconductor device D being irradiated with the laser light. The electrical signal image is, for example, an OBIC image which is a photovoltaic current image, an OBIRCH image which is an electricity quantity change image, an SDL image which is a correct/incorrect information image, a LADA image, and the like.

As a first analysis, the semiconductor device D is irradiated with the first laser light and the second laser light. In the first analysis, the stimulus signal application part 60 does not apply the stimulus signal to the semiconductor device D. The semiconductor device D that receives the laser light may generate a photovoltaic current. The electrical signal acquisition part 61 outputs a current value or a current change value of the photovoltaic current as the electrical signal characteristic value. The electrical signal image based on the electrical signal characteristic value obtained in the first analysis is the OBIC image.

As a second analysis, the semiconductor device D is irradiated with the first laser light and the second laser light. In the second analysis, the stimulus signal application part 60 applies a constant current which is the stimulus signal to the semiconductor device D. The stimulus signal may be a constant voltage. When the semiconductor device D that has received the stimulus signal is irradiated with the laser light, the resistance value of the irradiation position in the semiconductor device D changes. The electrical signal acquisition part 61 outputs a voltage value or a change value of the voltage according to a change in the resistance value as the electrical signal characteristic value. The electrical signal image based on the electrical signal characteristic value obtained in the second analysis is the OBIRCH image.

As a third analysis, the semiconductor device D is irradiated with the first laser light and the second laser light. In the third analysis, a laser having a wavelength at which the carrier is not excited is adopted as the first laser light and the second laser light. Further, in the third analysis, the stimulus signal application part 60 applies a stimulus signal such as a test pattern. When the semiconductor device D that has received the stimulus signal is irradiated with laser light having a wavelength at which the carrier is not excited, the malfunction state of the semiconductor device D can be detected. The electrical signal acquisition part 61 outputs information related to the malfunction state (for example, a PASS/FAIL signal) as the electrical signal characteristic value. An image obtained by converting the electrical signal characteristic value obtained in the third analysis into the luminance value is the SDL image.

As a fourth analysis, the semiconductor device D is irradiated with the first laser light and the second laser light. In the fourth analysis, a laser having a wavelength at which the carrier is excited is adopted as the first laser light and the second laser light. Further, in the fourth analysis, the stimulus signal application part 60 applies a stimulus signal such as a test pattern. When the semiconductor device D that has received the stimulus signal is irradiated with laser light having a wavelength at which the carrier is excited, the malfunction state of the semiconductor device D can be detected. The electrical signal acquisition part 61 outputs information related to the malfunction state (for example, a PASS/FAIL signal) as the electrical signal characteristic value. An image obtained by converting the electrical signal characteristic value obtained in the fourth analysis into the luminance value is the LADA image.

<Marking Step S120B>

A marking step S120B of the third embodiment is the same as the marking step S120A of the second embodiment. When marking is performed by the second observation optical system 22B, the second observation optical system 22B may include a marking laser light source, an XYZ stage, and an illumination light source.

The analysis device 1B includes the first analysis part 10B that irradiates the semiconductor device D with the light generated by the first light source 12B via the first observation optical system 13B having the first optical scanning part 13s, the second analysis part 20B that irradiates the semiconductor device D with the light generated by the second light source 21B via the second observation optical system 22B having the second optical scanning part 22s, the device arrangement part 30 having the wafer chuck 32 disposed between the first analysis part 10B and the second analysis part 20B to hold the semiconductor device D and provided with the alignment target 50 for aligning the optical scanning region of the first observation optical system 13B with the optical scanning region of the second observation optical system 22B and in which the wafer chuck 32 is moved relative to the first analysis part 10B and the second analysis part 20B, the electrical signal acquisition part 61 that receives an electrical signal output by the semiconductor device D, and a control part 41b that outputs a command to the first analysis part 10B, the second analysis part 20B, the device arrangement part 30, and the electrical signal acquisition part 61. The alignment target 50 can be detected by the first analysis part 10B from one side of the alignment target 50 and can be detected by the second analysis part 20B from the other side of the alignment target 50. The control part 41b outputs an alignment command that moves the wafer chuck 32 to a position at which the alignment target 50 can be detected by the first analysis part 10B and then aligns the optical scanning region of the second observation optical system 22B with the optical scanning region of the first observation optical system 13B with the alignment target 50 as a reference to the second analysis part 20B and the device arrangement part 30. Further, the control part 41b outputs an analysis command that irradiates the semiconductor device D with light from at least one of the first analysis part 10B and the second analysis part 20B and receives an electrical signal from the semiconductor device D with the electrical signal acquisition part 61 in a state in which the positional relationship between the optical scanning region of the first observation optical system 13B and the optical scanning region of the second observation optical system 22B is maintained to the first analysis part 10B, the second analysis part 20B, the electrical signal acquisition part 61, and the device arrangement part 30.

A semiconductor fault analysis method that analyzes the semiconductor device D using the analysis device 1B includes an alignment step (S100B) of moving the wafer chuck 32 to the position at which the alignment target 50 can be detected by the first analysis part 10B and then aligning the optical scanning region of the second observation optical system 22B with the optical scanning region of the first observation optical system 13B with the alignment target 50 as a reference, and an analysis step (S110B) of irradiating the semiconductor device D with light from at least one of the first analysis part 10B and the second analysis part 20B and receiving an electrical signal from the semiconductor device D with the electrical signal acquisition part 61 in a state in which the positional relationship between the optical scanning region of the first observation optical system 13B and the optical scanning region of the second observation optical system 22B is maintained.

The analysis device 1B irradiates the semiconductor device D with light in a state in which the positional relationship between the optical scanning region of the first observation optical system 13B and the optical scanning region of the second observation optical system 22B is maintained. Therefore, since the optical scanning regions of the first observation optical system 13B and the second observation optical system 22B coincide with each other, the failure place of the semiconductor device D can be satisfactorily detected.

Semiconductor Fault Analysis Device of Fourth Embodiment (Fourth embodiment) A semiconductor fault analysis device according to a fourth embodiment identifies a failure place by an optical probing technique called EOP or electro-optical frequency mapping (EOFM). Further, optical probed thermo-reflectance image mapping (OPTIM) may be performed using EOFM. The optical probing technology identifies a position of a circuit that operates at a desired frequency. In the optical probing technique, an integrated circuit is irradiated with light emitted from a light source. The light reflected by the integrated circuit is detected by an optical sensor. A signal component having a target frequency is extracted from a detection signal output from the optical sensor. Amplitude energy of the extracted signal component is displayed as a passage of time. Further, the amplitude energy of the extracted signal component is displayed as a two-dimensional mapping.

That is, the optical probing technique analyzes the failure of the semiconductor device D based on an intensity modulation of the light from the semiconductor device D being driven. Therefore, the semiconductor fault analysis device applies an electrical signal having a predetermined modulation frequency to the semiconductor device D. A modulation frequency in this case is often higher than a frequency of the stimulus signal used in an analysis of identifying a position of the heat source. For example, the semiconductor fault analysis device applies a drive current having a frequency equivalent to that of a drive signal of the semiconductor device D as the stimulus signal.

As shown in FIG. 15, the semiconductor fault analysis device of the fourth embodiment (hereinafter referred to as "analysis device 1C") includes a first analysis part 10C, a second analysis part 20C, a device arrangement part 30, a computer 40, and a stimulus signal application part 60. That is, the analysis device 1C of the fourth embodiment does not include the electrical signal acquisition part 61 included in the analysis device 1B of the third embodiment.

The first analysis part 10C includes a first light source 12C, a first observation optical system 13C (a first optical system), an XYZ stage 14 (a first drive part), and a first camera 15C (a first optical detection part). The first light source 12C is the same as the first light source 12B of the second embodiment. The first observation optical system 13C is the same as the first observation optical system 13B of the second embodiment. The first camera 15C is the same as the first camera 15B of the second embodiment.

The second analysis part 20C includes a second light source 21C, a second observation optical system 22C (a second optical system), and a second camera 24C (a second optical detection part). The second light source 21C is the same as the second light source 21B of the second embodiment. The second observation optical system 22C is the same as the second observation optical system 22B of the second embodiment. The second camera 24C is the same as the second camera 24B of the second embodiment.

Any one of the first analysis part 10C and the second analysis part 20C may have a function of putting a mark indicating a failure place. That is, any one of the first analysis part 10C and the second analysis part 20C may have a marking laser light source included in the marking part 20 of the first embodiment.

Semiconductor Fault Analysis of Fourth Embodiment

Next, an analysis process of the analysis device 1C will be described. FIG. 16 is a flow chart showing a main process of the analysis process using the analysis device 1C.

<Alignment Process S100C>

An alignment step S100C of the fourth embodiment is the same as the alignment step S100B of the third embodiment. Therefore, the step (S102C) of aligning the optical scanning regions in the alignment step S100C of the fourth embodiment is the same as the step S102B of the third embodiment.

<Analysis Step S110C>

Next, the failure place in the semiconductor device D is identified (S110C). The first analysis part 10C irradiates the semiconductor device D with the light from the first light source 12C by the first optical scanning part 13s. The light output by the first light source 12C is, for example, light having a wavelength band of 530 nm or more. The light output by the first light source 12C is preferably light having a wavelength band of 1064 nm or more. The light is reflected on the front surface of the semiconductor device D. The reflected light is incident on the first analysis part 10C. The incident light is detected by the first camera 15C. The first camera 15C outputs information based on the reflected light to the computer 40. The image processing part 41c of the computer 40 generates an optical reflection image using the information output by the first camera 15C. In this operation, the stimulus signal application part 60 does not output the stimulus signal.

Next, the stimulus signal application part 60 outputs a stimulus signal such as a test pattern to the semiconductor device D. The first analysis part 10C irradiates the semiconductor device D that has received the stimulus signal with the light from the first light source 12C. In this operation, the light from the first light source 12C is radiated to an irradiation position selected by the user. The user may input the irradiation position to the computer 40 using the input part 41e while looking at the optical reflection image displayed on the display part 41d. The first camera 15C detects the reflected light from the semiconductor device D that is receiving the stimulus signal. Then, the first camera 15C outputs information based on the reflected light to the computer 40.

In the semiconductor device D that is receiving the stimulus signal, an element constituting the semiconductor device D is operating. The reflected light from the semiconductor device D in which the element is operating is modulated according to an operation of the element.

The image processing part 41c of the computer 40 generates a signal waveform using the detection signal output by the first camera 15C. The image processing part 41c displays the signal waveform on the display part 41d. Then, while the irradiation position changes based on the above-described optical reflection image, the detection signal is acquired, and the signal waveform is generated. It is possible to identify the failure place using the generated signal waveform.

The image processing part 41c may generate an electro-optical frequency mapping image (an EOFM image). The EOFM image is an image obtained by imaging phase difference information between the detection signal and the stimulus signal such as a test pattern in relation to the irradiation position. In this case, the phase difference information can be obtained from an AC component extracted from the detection signal. Further, an optical reflection image can be obtained by imaging the DC component extracted at the same time with the AC component in association with the irradiation position. Then, an overlapping image in which the EOFM image overlaps the optical reflection image can be used as the analysis image.

Further, the second analysis part 20C also performs the same process as the analysis operation in the first analysis part 10C described above. The analysis operation in the first analysis part 10C and the analysis operation in the second analysis part 20C may be performed in parallel. Moreover, the operations may be performed alternately.

<Marking Step S120C>

A marking step S120C of the fourth embodiment is the same as the marking step S120A of the second embodiment. When marking is performed by the second observation optical system 22C, the second observation optical system 22B may include a marking laser light source, an XYZ stage, and an illumination light source.

The analysis device 1C includes the first analysis part 10C that irradiates the semiconductor device D with the light generated by the first light source 12C via the first observation optical system 13C having the first optical scanning part 13s and receives the first response light from the semiconductor device D generated according to the light of the first light source 12C with the first camera 15C, the second analysis part 20C that irradiates the semiconductor device D with the light generated by the second light source 21C via the second observation optical system 22C having the second optical scanning part 22s and receives the second response light from the semiconductor device D generated according to the light of the second light source 21C with the second camera 24C, the device arrangement part 30 having the wafer chuck 32 disposed between the first analysis part 10C and the second analysis part 20C to hold the semiconductor device D and provided with the alignment target 50 for aligning the optical scanning region of the first observation optical system 13C with the optical scanning region of the second observation optical system 22C and in which the wafer chuck 32 moves relative to the first analysis part 10C and the second analysis part 20C, the stimulus signal application part 60 that applies a stimulus signal to the semiconductor device D, and a control part 41b that outputs a command to the first analysis part 10C, the second analysis part 20C, the device arrangement part 30, and the stimulus signal application part 60. The alignment target 50 can be detected by the first analysis part 10C from one side of the alignment target 50 and can be detected by the second analysis part 20C from the other side of the alignment target 50. The control part 41b outputs an alignment command that moves the wafer chuck 32 to a position at which the alignment target 50 can be detected by the first camera 15C and then aligns the optical scanning region of the second observation optical system 22C with the optical scanning region of the first observation optical system 13C with the alignment target 50 as a reference to the second analysis part 20C and the device arrangement part 30. Further, the control part 41b outputs an analysis command that irradiates the semiconductor device D with the light from at least one of the first analysis part 10C and the second analysis part 20C and receives at least one of the first response light and the second response light from the semiconductor device D with at least one of the first camera 15C and the second camera 24C in a state in which the positional relationship between the optical scanning region of the first observation optical system 13C and the optical scanning region of the second observation optical system 22C is maintained and the stimulus signal is applied to the semiconductor device D to the first analysis part 10C, the second analysis part 20C, the stimulus signal application part 60, and the device arrangement part 30.

The semiconductor fault analysis method that analyzes a semiconductor device using the analysis device 1C includes an alignment step (S100C) of moving the wafer chuck 32 to a position at which the alignment target 50 can be detected by the first camera 15C and then aligning the optical scanning region of the second observation optical system 22C with the optical scanning region of the first observation optical system 13C with the alignment target 50 as a reference, and an analysis step (S110C) of irradiating the semiconductor device D with the light from at least one of the first analysis part 10C and the second analysis part 20C and receiving at least one of the first response light and the second response light from the semiconductor device D with at least one of the first camera 15C and the second camera 24C in a state in which the positional relationship between the optical scanning region of the first observation optical system 13C and the optical scanning region of the second observation optical system 22C is maintained and the stimulus signal is applied to the semiconductor device D.

The analysis device 1C irradiates the semiconductor device D with light while the positional relationship between the optical scanning region of the first observation optical system 13C and the optical scanning region of the second observation optical system 22C is maintained. Therefore, since the optical scanning regions of the first observation optical system 13C and the second observation optical system 22C coincide with each other, the failure place in the semiconductor device D can be satisfactorily detected.

REFERENCE SIGNS LIST 1, 1A, 1B, 1C: Analysis device (semiconductor fault analysis device), 10: Analysis part, 10A, 10B, 10C: First analysis part, 11: Tester unit, 12: Light source, 13: Observation optical system (first optical system), 14: XYZ stage (first drive part), 15: Two-dimensional camera (first optical detection part), 20: Marking part, 20A, 20B, 20C: Second analysis part, 21: Laser light source, 22: Laser marking optical system (second optical system), 23: XYZ stage (second drive part), 24: Probing camera (second optical detection part), 25: Illumination light source, 30: Device arrangement part, 31: Sample stage, 32: Wafer chuck, 33: XY drive part (third drive part), 32a: Device holding part, 32b: Target hole, 40: Computer, 41a: Condition setting part, 41b: Control part, 41c: Image processing part, 41e: Input part, 41d: Display part, 50: Alignment target, 50a: Light transmission part, 50b: Opaque part, D: Semiconductor device, ME: Metal layer, fp: Failure place, mp: Marking place.

The invention claimed is:

1. A semiconductor fault analysis device comprising:
a first analyzer in which a first optical detector receives light emitted by a semiconductor device via a first optical system, and the first optical system is moved relative to the semiconductor device by a first driver;
a second analyzer in which a second optical detector receives light emitted by the semiconductor device via a second optical system, and the second optical system is moved relative to the semiconductor device by a second driver;
a device arrangement part having a chuck disposed between the first analyzer and the second analyzer to hold the semiconductor device and provided with a target that aligns an optical axis of the first optical system with an optical axis of the second optical system, the chuck being moved relative to the first analyzer and the second analyzer;
a stimulus signal applicator configured to apply a stimulus signal to the semiconductor device; and
a controller configured to output a command to the first analyzer, the second analyzer, the device arrangement part, and the stimulus signal applicator,
wherein the target is detectable by the first analyzer from one side of the target and is detectable by the second analyzer from the other side of the target, and
the controller outputs an alignment command that moves the chuck to a position at which the target is detectable by the first optical detector and then aligns the optical axis of the second optical system with the optical axis of the first optical system with the target as a reference to the second analyzer and the device arrangement part, and outputs an analysis command that applies a stimulus signal to the semiconductor device and receives light from the semiconductor device emitted according to the stimulus signal with at least one of the first optical detector and the second optical detector in a state in which a positional relationship between the optical axis of the first optical system and the optical axis of the second optical system is maintained to the first analyzer, the second analyzer, the stimulus signal applicator, and the device arrangement part.

2. The semiconductor fault analysis device according to claim 1, wherein the alignment command causes the first optical detector to acquire a first image of the target from one side, causes the second optical detector to acquire a second image of the target from the other side, and moves the second optical system based on the first image and the second image so that the optical axis of the second optical system is aligned with the optical axis of the first optical system.

3. The semiconductor fault analysis device according to claim 1, wherein the analysis command causes the chuck to be moved by a third driver included in the device arrangement part so that the semiconductor device overlaps the optical axis of the first optical system and the optical axis of the second optical system and then causes the semiconductor device to be analyzed.

4. The semiconductor fault analysis device according to claim 1, wherein the target is provided at a position different from a device holder in which the semiconductor device is held in the chuck.

5. The semiconductor fault analysis device according to claim 1, wherein the first optical detector acquires a first image of the target seen from one side, and
the second optical detector acquires a second image of the target seen from the other side.

6. The semiconductor fault analysis device according to claim 1, wherein the target includes a light transmission part which transmits light that is detectable by the first optical detector and the second optical detector.

7. A semiconductor fault analysis device comprising:
a first analyzer configured to irradiate a semiconductor device with light generated by a first light source via a first optical system having a first optical scanner;
a second analyzer configured to irradiate the semiconductor device with light generated by a second light source via a second optical system having a second optical scanner;
a device arrangement part having a chuck disposed between the first analyzer and the second analyzer to hold the semiconductor device and provided with a target that aligns a center of an optical scanning region of the first optical system with a center of an optical scanning region of the second optical system, the chuck being moved relative to the first analyzer and the second analyzer;
an electrical signal acquisition part configured to receive an electrical signal output by the semiconductor device; and
a controller configured to output a command to the first analyzer, the second analyzer, the device arrangement part, and the electrical signal acquisition part,
wherein the target is detectable by the first analyzer from one side of the target and is detectable by the second analyzer from the other side of the target, and
the controller outputs an alignment command that moves the chuck to a position at which the target is detectable by the first analyzer and then aligns the center of the optical scanning region of the second optical system with the center of the optical scanning region of the first optical system with the target as a reference to the second analyzer and the device arrangement part, and outputs an analysis command that irradiates the semiconductor device with light from at least one of the first analyzer and the second analyzer and receives an electrical signal from the semiconductor device by the electrical signal acquisition part in a state in which a positional relationship between the center of the optical scanning region of the first optical system and the center of the optical scanning region of the second optical system is maintained to the first analyzer, the second analyzer, the electrical signal acquisition part, and the device arrangement part.

8. The semiconductor fault analysis device according to claim 7, wherein the first analyzer includes a first optical detector that receives light from one side of the semiconductor device,
the second analyzer includes a second optical detector that receives light from the other side of the semiconductor device, and
the alignment command aligns the center of the scanning region of the first optical system with the center of the scanning region of the second optical system by causing the first optical detector to acquire a first image of the target from one side, causing the second optical detector to acquire a second image of the target from the other side, and aligning the optical axis of the second optical system with the optical axis of the first optical system based on the first image and the second image.

9. The semiconductor fault analysis device according to claim 7, wherein the analysis command causes the chuck to be moved by a third driver included in the device arrangement part so that the semiconductor device overlaps the optical scanning region of the first optical system and the optical scanning region of the second optical system and then causes the semiconductor device to be analyzed.

10. The semiconductor fault analysis device according to claim 7, wherein the target is provided at a position different from a device holder in which the semiconductor device is held in the chuck.

11. The semiconductor fault analysis device according to claim 8, wherein the first analyzer includes a first optical detector that receives light from one side of the semiconductor device,
the second analyzer includes a second optical detector that receives light from the other side of the semiconductor device,
the first optical detector acquires a first image of the target seen from one side, and
the second optical detector acquires a second image of the target seen from the other side.

12. The semiconductor fault analysis device according to claim 8, wherein the first analyzer includes a first optical detector that receives light from one side of the semiconductor device,
the second analyzer includes a second optical detector that receives light from the other side of the semiconductor device, and
the target includes a light transmission part which transmits light that is detectable by the first optical detector and the second optical detector.

13. A semiconductor fault analysis device comprising:
a first analyzer in which a semiconductor device is irradiated with light generated by a first light source via a first optical system having a first optical scanner, and a first optical detector receives first response light from the semiconductor device generated according to the light of the first light source;
a second analyzer in which the semiconductor device is irradiated with light generated by a second light source via a second optical system having a second optical scanner, and a second optical detector receives second response light from the semiconductor device generated according to the light of the second light source;
a device arrangement part having a chuck disposed between the first analyzer and the second analyzer to hold the semiconductor device and provided with a target that aligns a center of an optical scanning region of the first optical system with a center of an optical scanning region of the second optical system, the chuck being moved relative to the first analyzer and the second analyzer;
a stimulus signal applicator configured to apply a stimulus signal to the semiconductor device; and
a controller configured to output a command to the first analyzer, the second analyzer, the device arrangement part, and the stimulus signal applicator,
wherein the target is detectable by the first analyzer from one side of the target and is detectable by the second analyzer from the other side of the target, and
the controller outputs an alignment command that moves the chuck to a position at which the target is detectable by the first optical detector and then aligns the center of the optical scanning region of the second optical system with the center of the optical scanning region of the first optical system with the target as a reference to the second analyzer and the device arrangement part, and outputs an analysis command that irradiates the semiconductor device with light from at least one of the first analyzer and the second analyzer and receives at least one of the first response light and the second response light from the semiconductor device with at least one of the first optical detector and the second optical detection part in a state in which a positional relationship between the center of the optical scanning region of the first optical system and the center of the optical scanning region of the second optical system is maintained and the stimulus signal is applied to the semiconductor device to the first analyzer, the second analyzer, the stimulus signal applicator, and the device arrangement part.

14. The semiconductor fault analysis device according to claim 13, wherein the alignment command aligns the center of the scanning region of the first optical system with the center of the scanning region of the second optical system by causing the first optical detector to acquire a first image of the target from one side, causing the second optical detector to acquire a second image of the target from the other side, and aligning the optical axis of the second optical system with the optical axis of the first optical system based on the first image and the second image.

15. The semiconductor fault analysis device according to claim 12, wherein the analysis command causes the chuck to be moved by a third part driver included in the device arrangement part so that the semiconductor device overlaps the optical scanning region of the first optical system and the optical scanning region of the second optical system and then causes the semiconductor device to be analyzed.

16. The semiconductor fault analysis device according to claim 12, wherein the target is provided at a position different from a device holder in which the semiconductor device is held in the chuck.

17. The semiconductor fault analysis device according to claim 13, wherein the first optical detector acquires a first image of the target seen from one side, and
the second optical detector acquires a second image of the target seen from the other side.

18. The semiconductor fault analysis device according to claim 13, wherein the target includes a light transmission part which transmits light that is detectable by the first optical detector and the second optical detector.

19. A semiconductor fault analysis method which analyzes a semiconductor device using a semiconductor fault analysis device, wherein the semiconductor fault analysis device includes:
a first analyzer in which a first optical detector receives light emitted by a semiconductor device via a first optical system, and the first optical system is moved relative to the semiconductor device by a first driver;
a second analyzer in which a second optical detector receives light emitted by the semiconductor device via a second optical system, and the second optical system is moved relative to the semiconductor device by a second driver;
a device arrangement part having a chuck disposed between the first analyzer and the second analyzer to hold the semiconductor device and provided with a target that aligns an optical axis of the first optical system with an optical axis of the second optical system, the chuck being moved relative to the first analyzer and the second analyzer;
a stimulus signal applicator configured to apply a stimulus signal to the semiconductor device; and
a controller configured to output a command to the first analyzer, the second analyzer, the device arrangement part, and the stimulus signal applicator,
wherein the target is detectable by the first analyzer from one side of the target and is detectable by the second analyzer from the other side of the target,
the method includes:
moving the chuck to a position at which the target is detectable by the first optical detector and then aligning the optical axis of the second optical system with the optical axis of the first optical system with the target as a reference; and
applying a stimulus signal to the semiconductor device and receiving light from the semiconductor device emitted according to the stimulus signal with at least one of the first optical detector and the second optical detector in a state in which a positional relationship between the optical axis of the first optical system and the optical axis of the second optical system is maintained.

20. The semiconductor fault analysis method according to claim 19 further comprising receiving light from the semiconductor device and then putting a mark indicating a failure place in the semiconductor device obtained by the first analyzer and the second analyzer on the semiconductor device, after the analysis step.

21. A semiconductor fault analysis method which analyzes a semiconductor device using a semiconductor fault analysis device,
wherein the semiconductor fault analysis device includes:
a first analyzer configured to irradiate a semiconductor device with light generated by a first light source via a first optical system having a first optical scanner;
a second analyzer configured to irradiate the semiconductor device with light generated by a second light source via a second optical system having a second optical scanner;
a device arrangement part having a chuck disposed between the first analyzer and the second analyzer to hold the semiconductor device and provided with a target that aligns a center of an optical scanning region of the first optical system with a center of an optical scanning region of the second optical system, the chuck being moved relative to the first analyzer and the second analyzer;
an electrical signal acquisition part configured to receive an electrical signal output by the semiconductor device; and
a controller configured to output a command to the first analyzer, the second analyzer, the device arrangement part, and the electrical signal acquisition part,
wherein the target is detectable by the first analyzer from one side of the target and is detectable by the second analyzer from the other side of the target,
the method includes:
moving the chuck to a position at which the target is detectable by the first analyzer and then aligning the center of the optical scanning region of the second optical system with the center of the optical scanning region of the first optical system with the target as a reference; and
irradiating the semiconductor device with light from at least one of the first analyzer and the second analyzer and receiving an electrical signal from the semiconductor device by the electrical signal acquisition part in a state in which a positional relationship between the center of the optical scanning region of the first optical system and the center of the optical scanning region of the second optical system is maintained.

22. The semiconductor fault analysis method according to claim 21 further comprising receiving light from the semiconductor device and then putting a mark indicating a failure place in the semiconductor device obtained by the first analyzer and the second analyzer on the semiconductor device, after the analysis step.

23. A semiconductor fault analysis method which analyzes a semiconductor device using a semiconductor fault analysis device,
wherein the semiconductor fault analysis device includes:
a first analyzer in which a semiconductor device is irradiated with light generated by a first light source via a first optical system having a first optical scanner, and a first optical detector receives first response light from the semiconductor device generated according to the light of the first light source;
a second analyzer in which the semiconductor device is irradiated with light generated by a second light source via a second optical system having a second optical scanner, and a second optical detector receives second response light from the semiconductor device generated according to the light of the second light source;
a device arrangement part having a chuck disposed between the first analyzer and the second analyzer to hold the semiconductor device and provided with a target that aligns a center of an optical scanning region of the first optical system with a center of an optical scanning region of the second optical system, the chuck being moved relative to the first analyzer and the second analyzer;
a stimulus signal applicator configured to apply a stimulus signal to the semiconductor device; and
a controller configured to output a command to the first analyzer, the second analyzer, the device arrangement part, and the stimulus signal applicator,
wherein the target is detectable by the first analyzer from one side of the target and is detectable by the second analyzer from the other side of the target,
the method comprising:
moving the chuck to a position at which the target is detectable by the first optical detector and then aligning the center of the optical scanning region of the second optical system with the center of the optical scanning region of the first optical system with the target as a reference; and irradiating the semiconductor device with light from at least one of the first analyzer and the second analyzer and receiving at least one of the first response light and the second response light from the semiconductor device with at least one of the first optical detector and the second optical detector in a state in which a positional relationship between the center of the optical scanning region of the first optical system and the center of the optical scanning region of the second optical system is maintained and the stimulus signal is applied to the semiconductor device.

24. The semiconductor fault analysis method according to claim 23 further comprising receiving light from the semiconductor device and then putting a mark indicating a failure place in the semiconductor device obtained by the first analyzer and the second analyzer on the semiconductor device, after the analysis step.

* * * * *